United States Patent
Zhang et al.

(10) Patent No.: US 12,402,459 B2
(45) Date of Patent: Aug. 26, 2025

(54) DISPLAY MODULE AND DISPLAY DEVICE

(71) Applicant: Wuhan Tianma Micro-Electronics Co., Ltd., Wuhan (CN)

(72) Inventors: Pan Zhang, Wuhan (CN); Lu Li, Wuhan (CN); Haili Zhu, Wuhan (CN); Yan Zou, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 459 days.

(21) Appl. No.: 18/108,724

(22) Filed: Feb. 13, 2023

(65) Prior Publication Data
US 2024/0105895 A1    Mar. 28, 2024

(51) Int. Cl.
*H10H 20/857* (2025.01)
*H05K 1/18* (2006.01)

(52) U.S. Cl.
CPC ........... *H10H 20/857* (2025.01); *H05K 1/189* (2013.01); *H05K 2201/10128* (2013.01)

(58) Field of Classification Search
CPC .............. H10H 20/857; H05K 1/189; H05K 1/117–118; H05K 2201/10128; G09F 9/30
See application file for complete search history.

(56) References Cited

FOREIGN PATENT DOCUMENTS

| CN | 2547019 Y | 4/2003 | |
|---|---|---|---|
| CN | 1917293 A | 2/2007 | |
| CN | 101852929 A | 10/2010 | |
| CN | 212571430 U | 2/2021 | |
| CN | 113677093 A | * 11/2021 | ............. H05K 3/361 |
| CN | 114914726 A | 8/2022 | |
| KR | 101589056 B1 | 1/2016 | |

OTHER PUBLICATIONS

Machine translation of CN-113677093-A (Year: 2021).*

* cited by examiner

*Primary Examiner* — James R Greece
*Assistant Examiner* — Jose M Diaz
(74) *Attorney, Agent, or Firm* — Anova Law Group, PLLC

(57) ABSTRACT

A display module and a display device are provided. The display module includes a display panel, a flexible circuit board, and a printed circuit board. The display panel includes a bonding area. The flexible circuit board and the printed circuit board are electrically bonded and connected to the display panel in the bonding area, and are connected by a connector. The connector includes a first connection board and a second connection board. A side of the first connection board includes a groove including first pins. A side of the second connection board facing the first connection board includes second pins. The first pins and the second pins have a one-to-one correspondence. The second pins are plugged into the grooves, and are in contact with and electrically connected to the first pins; and a portion of at least one of the first pins is coated with a first insulating layer.

20 Claims, 24 Drawing Sheets

DISPLAY MODULE AND DISPLAY DEVICE

CROSS-REFERENCE TO RELATED APPLICATION

This application claims the priority of Chinese Patent Application No. 202211192012.X, filed on Sep. 28, 2022, the content of which is incorporated herein by reference in its entirety.

TECHNICAL FIELD

The present disclosure generally relates to the field of display technologies and, more particularly, relates to a display module and a display device.

BACKGROUND

With rapid development of flat panel displays and improvement of people's living standards, display devices are more and more widely used in people's daily life. A connector is an indispensable part of a display device. The connector is mainly used to set up a bridge of communication between blocked or isolated circuits in circuits of the display device, such that current can flow and the circuit can achieve predetermined functions. Forms and structures of connectors are widely different, and there are various forms of connectors with different application objects, frequencies, power and application environments.

In existing display devices, connectors used to provide the signal communication between a circuit board for providing driving signals and a display panel are mainly connectors with plug-in structures. Electrical connection between the display panel and a power supply can be conveniently and quickly completed by using the form of plug-in connectors, which is beneficial to industrialized mass production. However, in the current conventional design of connectors, and metallic conductive pins are exposed, and there is no dust-proof effect. It is prone to the problem of misplaced plugging and unplugging during plugging and unplugging with electricity. Once the improper operation of misplaced plugging and plugging occurs, it is easy to cause static electricity and damage the panel. The panel quality and product yield may be affected. Also, the operator's brute force dislocation and oblique insertion may easily cause problems such as connector damage.

Therefore, to provide a display module and a display device that can avoid electrostatic damage to the panel during the process of plugging and unplugging the connector, to protect equipment and improve product yield, is a technical problem to be solved.

SUMMARY

One aspect of the present disclosure provides a display module. The display module includes: a display panel, a flexible circuit board, and a printed circuit board. The display panel includes a bonding area. The flexible circuit board and the printed circuit board are electrically bonded and connected to the display panel in the bonding area. The flexible circuit board and the printed circuit board are connected by a connector. The connector includes a first connection board and a second connection board. A side of the first connection board facing the second connection board includes a groove. The groove includes a plurality of first pins. A side of the second connection board facing the first connection board includes a plurality of second pins. The plurality of first pins and the plurality of second pins have a one-to-one correspondence. The plurality of second pins is plugged into the grooves, and is in contact with and electrically connected to the plurality of first pins; and a portion of at least one of the plurality of first pin is coated with a first insulating layer.

Another aspect of the present disclosure provides a display device. The display device includes a display module. The display module includes a display panel, a flexible circuit board, and a printed circuit board. The display panel includes a bonding area. The flexible circuit board and the printed circuit board are electrically bonded and connected to the display panel in the bonding area. The flexible circuit board and the printed circuit board are connected by a connector. The connector includes a first connection board and a second connection board. A side of the first connection board facing the second connection board includes a groove. The groove includes a plurality of first pins. A side of the second connection board facing the first connection board includes a plurality of second pins. The plurality of first pins and the plurality of second pins have a one-to-one correspondence. The plurality of second pins is plugged into the grooves, and is in contact with and electrically connected to the plurality of first pins; and a portion of at least one of the plurality of first pin is coated with a first insulating layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
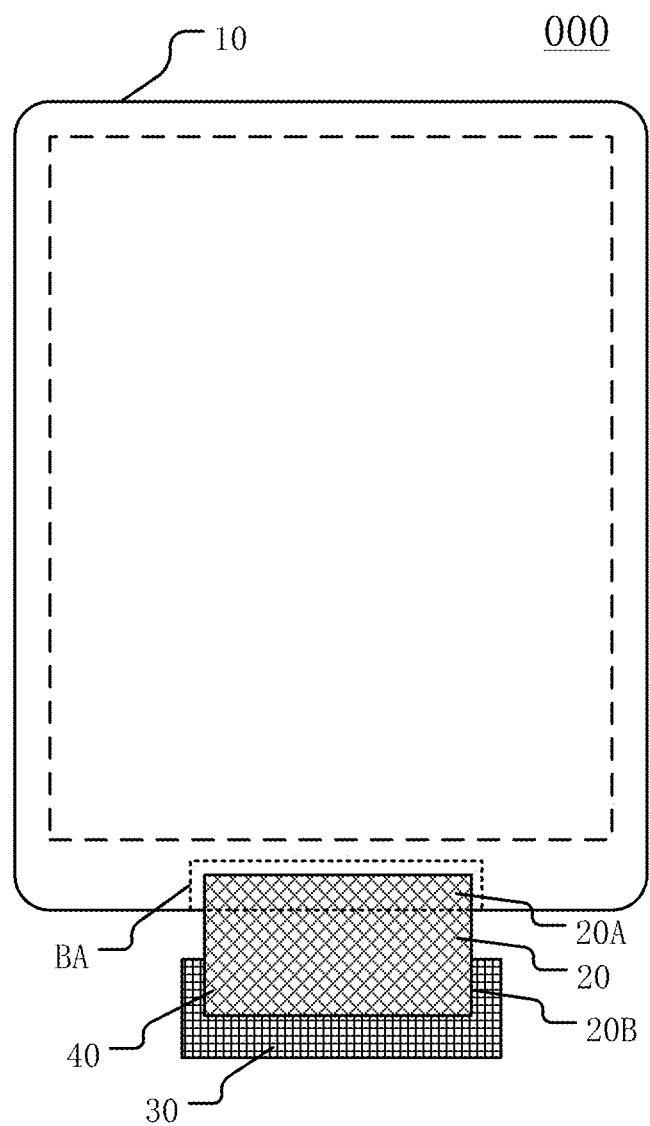
FIG. 1 illustrates a planar structure of an exemplary display module consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

Figure 2:
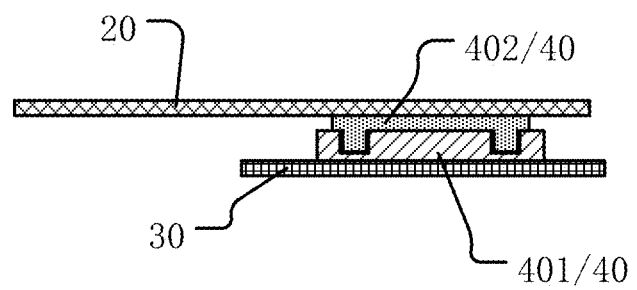
FIG. 2 illustrates a connecting structure of a flexible circuit board and a printed circuit board in FIG. 1 consistent with various disclosed embodiments in the present disclosure.
Figure 3:
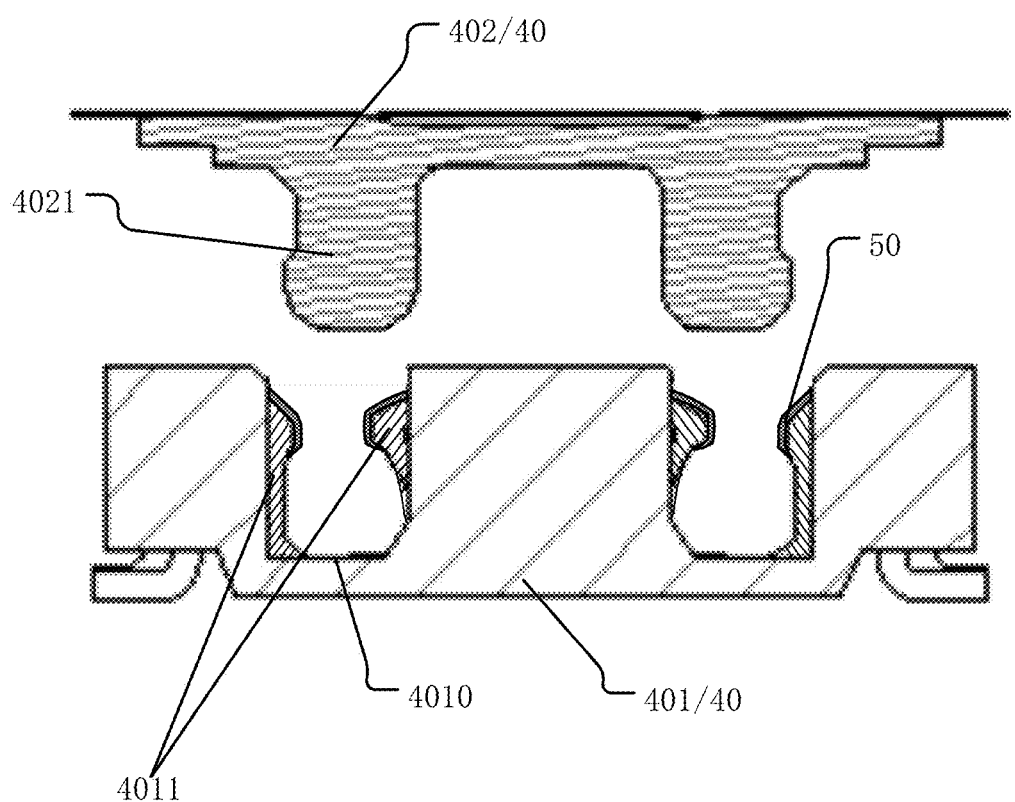
FIG. 3 illustrates an exploded structure of a cross-sectional view of a connector in FIG. 2, consistent with various disclosed embodiments in the present disclosure.
Figure 4:
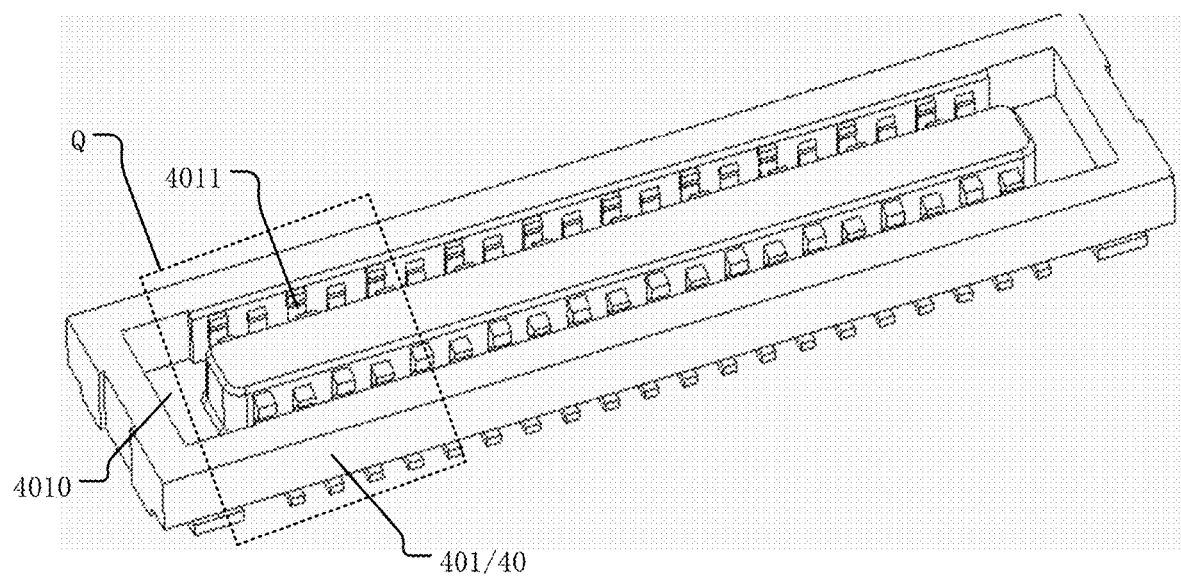
FIG. 4 illustrates a three-dimensional structure of a first connection board in FIG. 3, consistent with various disclosed embodiments in the present disclosure.
Figure 5:
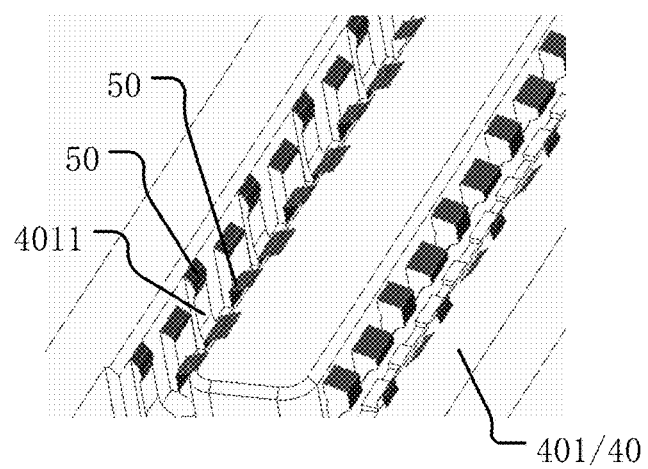
FIG. 5 illustrates a locally enlarged view of a Q region in FIG. 4 consistent with various disclosed embodiments in the present disclosure.

The present disclosure provides a display module. FIG. 1 is a schematic planar view of a display module provided by one embodiment of the present disclosure, FIG. 2 is a schematic diagram of a connection structure of a flexible circuit board and a printed circuit board in FIG. 1, FIG. 3 is an exploded structure of the cross-sectional structure of a connector in FIG. 2, FIG. 4 is a schematic three-dimensional structural diagram of a first connection board in FIG. 3, and FIG. 5 is a partially enlarged structural schematic diagram of the Q area in FIG. 4. As shown in FIG. 1 to FIG. 5, in one embodiment, the display module 000 may include a display panel 10, a flexible circuit board 20, and a printed circuit board 30. The display panel 10 may include a bonding area BA, and the flexible circuit board 20 and the printed circuit board 30 may be bonded and electrically connected to the display panel 10 in the bonding area BA.

The flexible circuit board 20 and the printed circuit board 30 may be connected through a connector 40.

The connector 40 may include a first connection board 401 and a second connection board 402.

A side of the first connection board 401 facing the second connection board 402 may be provided with a groove 4010, and a plurality of first pins 4011 may be disposed in the groove 4010.

A side of the second connection board 402 facing the first connection board 401 may be provided with a plurality of second pins 4021. The plurality of first pins 4011 and the plurality of second pins 4021 may have one-to-one correspondence. The plurality of second pins 4021 may be plugged into the grooves 4010 and connected. The plurality of second pin 4021 may be in contact and electrically connected with the plurality of first pins 4011.

A partial area of at least one of the plurality of first pins 4011 may be coated with a first insulating layer 50.

Specifically, in the present embodiment, the display module 000 may include the display panel 10, the flexible circuit board 20, and the printed circuit board 30. The flexible circuit board 20 and the printed circuit board 30 may be bonded and electrically connected to the display panel 10 in the bonding area BA of the display panel 10. Optionally, the flexible circuit board 20 may be bonded to the display panel 10 in the bonding area BA of the display panel 10. The flexible circuit board may be connected to 20 the printed circuit board 30 through the connector 40. Correspondingly, the printed circuit board 30 may provide the display panel 10 with electrical signals that drive the display panel 10 to realize functions such as display through the lines on the flexible circuit board 20.

In one embodiment, the printed circuit board 30 may be a provider of electrical connections for electronic components. Optionally, the printed circuit board 30 may include a substrate, and electronic components or a drive circuit integrated on the substrate. The flexible circuit board 20 (FPC) may be a highly reliable and excellent flexible printed circuit made of polyimide or polyester film as the base material plate. The display module 000 of this embodiment may include the display panel 10 and the printed circuit board 30. The electrical connection between the display panel 10 and the printed circuit board 30 may be generally connected by the flexible circuit board 20. The flexible circuit board 20 may be bonded to the display panel 10 to realize electrical signal transmission with the display panel 10. The electrical signal transmission between the flexible circuit board 20 and the printed circuit board 30 may be realized by plugging and connecting to the connector 40. The flexible circuit board 20 may generally include a pressing end 20A and a gold finger end 20B. The pressing end 20A of the flexible circuit board 20 may be pressed within the range of the bonding area BA of the display panel 10 to realize electrical connection with the display panel 10. At the same time, the connector 40 connected to the printed circuit board 30 may be disposed at the gold finger end 20B of the flexible circuit board 20. The connector 40 of this embodiment may include the first connection board 401 and the second connection board 402. Optionally, the first connection board 401 may be disposed at the position of the gold finger end 20B of the flexible circuit board 20 or at a corresponding position on the printed circuit board 30. The second connection board 402 may be disposed at the position of the gold finger end 20B of the flexible circuit board 20 or at the another one of corresponding positions on the printed circuit board 30. The side of the first connection board 401 facing the second connection board 402 may be provided with the groove 4010. The plurality of first pins 4011 may be disposed in the groove 4010. The side of the second connection board 402 facing the first connection board 401 may be provided with the plurality of second pins 4021. The plurality of first pins 4011 and the plurality of second pins 4021 may have one-to-one correspondence.

Optionally, the depth of the groove 4010 may not penetrate through the thickness of the first connection board 401, and the plurality of first pins 4011 may be disposed on the inner sidewall of the groove 4010 for subsequent plugging between the first connection board 401 and the second connection board 402. The plurality of second pins 4021 on the second connection board 402 may be plugged into the grooves 4010 to contact and electrically connect with the plurality of first pins 4011. Therefore, the electrical connection between the first connection board 401 and the second connection board 402 may be realized through the contact between the plurality of first pins 4011 on the first connection board 401 and the plurality of second pins 4021 on the second connection board 402, enabling the transmission of electrical signals between the driving circuit board 30 and the flexible circuit board 20. In this embodiment, the electrical connection between the flexible circuit board 20 and the printed circuit board 30 may be realized through the plugging and unplugging between the first connection board 401 and the second connection board 402 of the connector 40. Therefore, the electrical connection between the display panel 10 and the printed circuit board 30 may be realized through the flexible circuit board 20. In the present disclosure, a structure in which the flexible circuit board 20 and the printed circuit board 30 are electrically connected through the plugging and unplugging of the connector 40. The electrical connection between the display panel 10 and the printed circuit board 30 may be able to easily and quickly completed, which is beneficial to the industrialized mass production of the module.

However, in the existing technologies, pins on the connector generally use a conventional conductive design. The metal of the pins is exposed, and there is no fool-proofing effect. When plugging and unplugging with electricity occur, it is easy to cause static electricity damage to the display panel during the operation of plugging and unplugging with electricity. Operations of brute force with misalignment and oblique plugging could easily cause damage to the connector, which may induce poor yield of the module.

In the present embodiment, a partial area of at least one first pin 4011 of the plurality of first pins 4011 in the first connection board 401 may be coated with the first insulating layer 50. Optionally, in one embodiment, a partial area of each of the plurality of first pins 4011 in the first connection board 401 may be coated with the first insulating layer 50. Therefore, when the flexible circuit board 20 and the printed circuit board 30 are electrically connected through the connector 40, the plurality of second pins 4021 on the second connection board 402 may be plugged into the grooves 4010 opened in the first connection board 401, and may be electrically connected to the corresponding plurality of first pins 4011. Since a partial area of each of the plurality of first pins 4011 in the first connection board 401 may be coated with the first insulating layer 50, electrostatic breakdown because of the instantaneous contact between the plurality of first pins 4011 and the plurality of second pins 4021 during the instantaneous wrong plugging may be prevented. Therefore, electrostatic damage to the display panel 10 induced by plugging and unplugging of the connector 40 may be avoided. Further, since the first insulating layer 50 in this embodiment is not coated on the entire surface of the plurality of first pins 4011, the conductivity of the plurality of first pins 4011 may not be affected. Therefore, when the first connection board 401 and the second connection board 402 are plugged, the plurality of second pins 4021 and the areas of the plurality of first pins 4011 not coated with the first insulating layer 50 may still be guaranteed to contact to realize conductive transmission between the first connection board 401 and the second connection board 402. In this embodiment, the first insulating layer 50 may have been coated on a partial area of at least one of the plurality of first pins 4011 during the manufacturing process of the connector 40. There may be no need to remove the first insulating layer 50 after the first connection board 401 and the second connection board 402 are plugged and connected, which may be beneficial to reduce the overall process steps of the module.

The present disclosure does not specifically limit the type and structure of the display panel 10. During specific implementation, the solution of this embodiment may be applied to any type of display panel 10, as long as the connector 40 uses the design structure of this embodiment when the driving signal on the display panel 10 needs to realize electrical transmission through the flexible circuit board 20 and the driving circuit board 30. The structure of the display panel 10 is not described in detail in this embodiment.

For description purposes only, the drawings in this embodiment are merely illustrative of the shapes and numbers of the plurality of first pins 4011 and the plurality of second pins 4021 in the connector 40, and are used as examples only to illustrate the present disclosure. In various embodiments, during specific implementation, the shapes and numbers of the plurality of first pins 4011 and the plurality of second pins 4021 in the connector 40 are not limited to this, and other setting methods are also possible, as long as only a partial area of the surfaces of the plurality of first pins 4011 in the first connection board 401 is coated with the first insulating layer 50 to avoid the occurrence of electrostatic damage because of operation with electricity of the connector 40 in the process of aligning plugging and unplugging, which are not limited in this embodiment.

Figure 6:
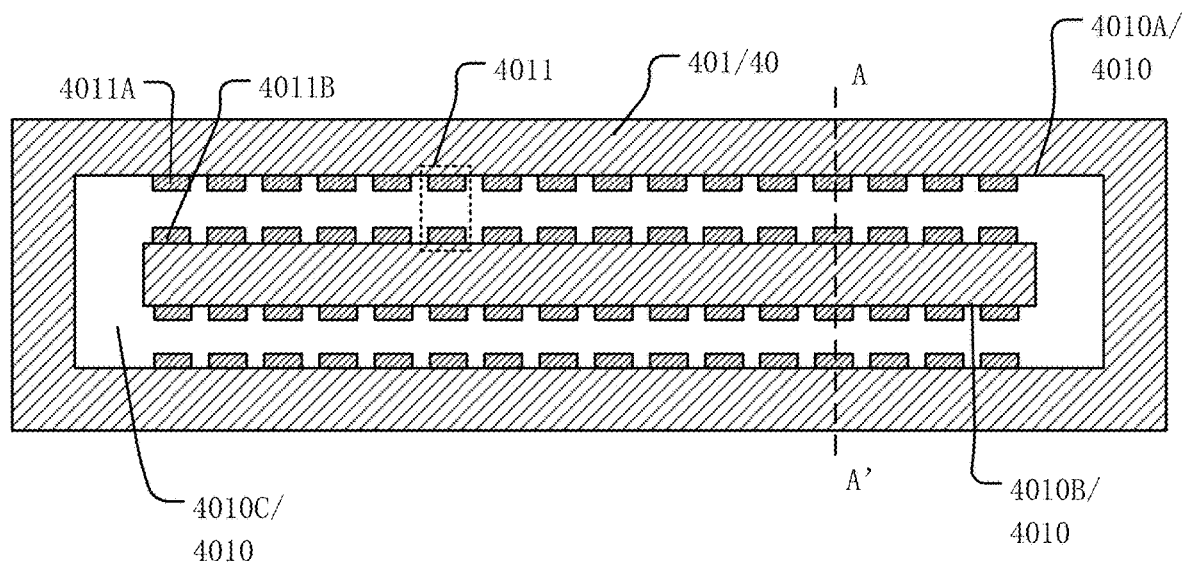
FIG. 6 illustrates a top-view structure of a first connection board in FIG. 4 consistent with various disclosed embodiments in the present disclosure.
Figure 7:
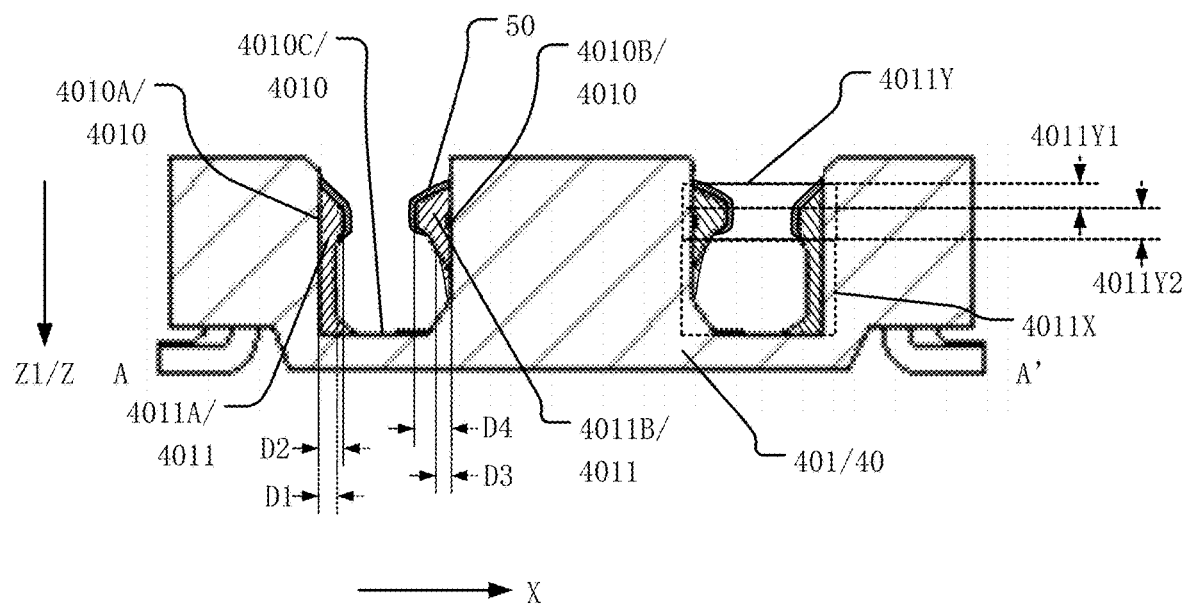
FIG. 7 illustrates a cross-sectional view along an A-A' direction in FIG. 6 consistent with various disclosed embodiments in the present disclosure.

In some embodiments as shown in FIG. 1 to FIG. 5, FIG. 6 which is a top view of the first connection board in FIG. 4, and FIG. 7 which is a cross-sectional view along the A-A' direction in FIG. 6, a shape of an orthographic projection of the groove 4010 of the first connection board 401 on a plane where the first connection board 401 is located may include a long strip.

The groove 4010 may include a first side wall 4010A and a second side wall 4010B. One first pin 4011 of the plurality of first pins 4011 may include a first sub-section 4011A and a second sub-section 4011B, where the first sub-section 4011A may be arranged on the first side wall 4010A and the second sub-section 4011B may be arranged on the second side wall 4010B.

In a direction Z perpendicular to the plane of the first connection board 401, the first sub-section 4011A and/or the second sub-section 4011B may include a first region 4011X and a second region 4011Y, where the first region 4011X is located on a side of the second region 4011Y close to the bottom of the groove 4010.

Along a direction X from the first sub-section 4011A to the second sub-section 4011B, the thickness D1 of the first sub-section 4011A in the first region 4011X may be smaller than a thickness D2 of the first sub-section 4011A in the second region 4011Y; and/or, along the direction X from the first sub-section 4011A to the second sub-section 4011B, a thickness D3 of the second sub-section 4011B in the first region 4011X may be smaller than a thickness D4 of the second sub-section 4011B in the second region 4011Y.

In the present embodiment, the groove 4010 may be provided at the side of the first connection board 401 facing the second connection board 402, and the groove 4010 may be a groove structure formed by recession of a surface of the first connection board 401 facing the second connection board 402 in a direction away from the second connection board 402. In the present embodiment, the shape of the orthographic projection of the groove 4010 on the plane where the first connection board 401 is located may be a long strip. In some other embodiment, the shape of the orthographic projection of the groove 4010 on the plane where the first connection board 401 is located may also be a closed ring or square, which is not limited in this embodiment. The present embodiment shown in drawings where the orthographic projection of the groove 4010 on the plane where the first connection board 401 is located is a rectangle is used as an example for illustration. The groove 4010 of the first connection board 401 may include the first side wall 4010A and the second side wall 4010B. Optionally, as shown in FIG. 3, the groove 4010 may be understood as including a groove bottom 4010C and a groove bottom 4010C, and the first sidewall 4010A and the second sidewall 4010B at two opposite sides of the groove bottom 4010C respectively. The plane where the first sidewall 4010A is located may be understood as intersecting or perpendicular to the plane where the first connection board 401 is located, and the plane where the second sidewall 4010B is located may be understood that it intersects or is perpendicular to the plane where the first connection board 401 is located. The plurality of first pins 4011 of the first connection board 401 may be disposed on two sidewalls of the groove 4010. One first pin 4011 of the plurality of first pins 4011 of the first connection board 401 may include a first sub-section 4011A and a second sub-section 4011B. The first sub-section 4011A and the second sub-section 4011B may be understood as independent pieces disposed on the two sidewalls of the groove 4010. The first sub-section 4011A may be disposed on the first side wall 4010A, and the second sub-section 4011B may be disposed on the second side wall 4010B. The first sub-section 4011A and the second sub-section 4011B may together form the one first pin 4011 of the first connection board 401. When the second connection board 402 is plugged into the first connection board 401, each of the plurality of second pins 4021 of the second connection board 402 may be in contact with the first sub-section 4011A and the second sub-section 4011B of a corresponding one of the plurality of first pins 4011 in the groove 4010, to realize electrical connection between the corresponding pins of the first connection board 401 and the second connection board 402.

In the present embodiment, along the direction Z perpendicular to the plane where the first connection board 401 is located, the first sub-section 4011A and/or the second sub-section 4011B may include the first region 4011X and the second region 4011Y with different thicknesses. That is, in the direction Z perpendicular to the plane where the first connection board 401 is located, the first sub-section 4011A may include a first region 4011X and a second region 4011Y with different thicknesses; or, the second sub-section 4011B may include a first region 4011X and a second region 4011Y with different thicknesses; or the first sub-section 4011A and the second sub-section 4011B each may include a first region 4011X and a second region 4011Y with different thicknesses. The first region 4011X may be closer to the groove bottom 4010C than the second region 4011Y. Along the direction X from the first sub-section 4011A to the second sub-section 4011B, the thickness D1 of the first sub-section 4011A in the first region 4011X may be smaller than the thickness D2 of the first sub-section 4011A in the second region 4011Y; and/or, along the direction X from the first sub-section 4011A to the second sub-section 4011B, a thickness D3 of the second sub-section 4011B in the first region 4011X may be smaller than a thickness D4 of the second sub-section 4011B in the second region 4011Y. Therefore, the first pin 401 formed by the two independent first sub-section 4011A and the second sub-section 4011B may form a relatively large space which is pluggable to a corresponding one of the plurality of second pins 4021 at a position close to the groove bottom 4010, while a space which is pluggable to the corresponding one of the plurality of second pins 4021 formed near the second connection board 402 may be smaller. The shape of the corresponding one of the plurality of second pins 4021 may match the shape of the first pin 4011. Correspondingly, after the corresponding second pin 4021 is plugged and connected into the position of the first pin 4011 of the shape, the corresponding second pin 4021 on the second connection board 402 may be firmly embedded into the first pin 4011 of the shape, which may be beneficial to improve the stability of the first connection board 401 and the second connection board 402 after they are plugged and connected.

Also, the space near the second connection board 402 which is pluggable to the corresponding one of the plurality of second pins 4021 formed by the first pin 401 composed of the two independent first sub-section 4011A and the second sub-section 4011B may be smaller. Therefore, When the corresponding second pin 4021 is plugged and connected into the first pin 4011, it may first contact the thicker second region 4011Y of the first sub-section 4011A and the second sub-section 4011B. The plugging and connecting operation may stop in time when misalignment is found, to prevent the corresponding second pin 4021 of the second connection board 402 from contacting the first pin 4011 too much in the groove 4010 and being deeply embedded. The problem that it is difficult to unplug may be avoided, reducing the probability of damage to the pins of the connector 40 during plug and unplug.

In some embodiments, as shown in FIG. 1 to FIG. 7, the first insulating layer 50 may be located on a surface of the first sub-section 4011A in the second region 4011Y; and/or the first insulating layer 50 may be located on a surface of the second sub-section 4011B in the second region 4011Y.

In the present embodiment, the first insulating layer 50 coated on the first pin 4011 may be located only on the surface of the first sub-section 4011A of the second region 4011Y, or the first insulating layer 50 may be located only on the surface of the second sub-section 4011B of the second region 4011Y, or the first insulating layer 50 may be located on the surfaces of the first sub-section 4011A and the second sub-section 4011B of the second region 4011Y. The lower end of a charged second pin 4021 of the plurality of second pins 4021 may first contact the surface of the first sub-section 4011A and/or the second sub-section 4011B of the corresponding first pin 4011 in the range of the second region 4011Y when the second connection board 402 is plugged downward into the first connection board 401. Therefore, in this embodiment, the first insulating layer 50 may be only applied to the surface of the first sub-section 4011A of the second region 4011Y and/or the surface of the second sub-section 4011B of the second region 4011Y. Correspondingly, it may be ensured that the final contact range between the first pin 4011 and the corresponding second pin 4021 is large enough to ensure the stability of the electrical connection between the first connection board 401 and the second connection board 402. Further, even when misplaced and plugged, the first insulating layer 50 on the surface of the first sub-section 4011A and/or the surface of the second sub-section 4011B of the second region 4011Y may play the role of electrostatic protection to avoid the electrostatic breakdown induced by instantaneous connection and conduction between the first pin 4011 and the corresponding second pin 4021, thereby preventing electrostatic damage to the display panel 10 during the plug and unplug of the connector 40 with electricity.

Figure 8:
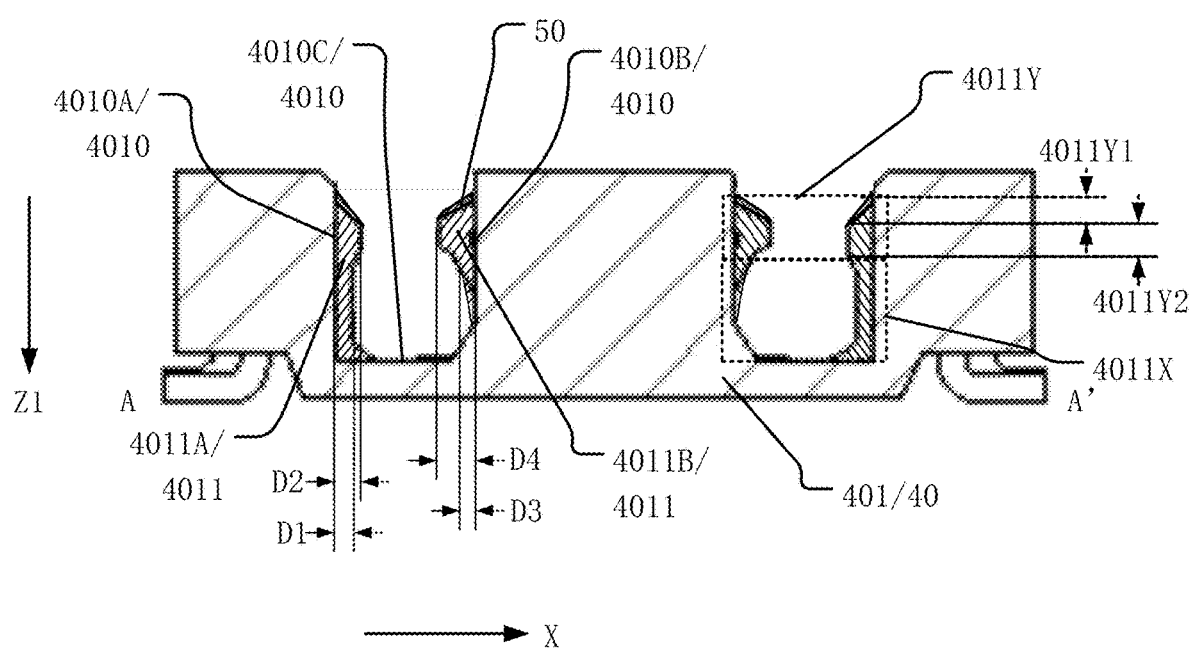
FIG. 8 illustrates another cross-sectional view along an A-A' direction in FIG. 6 consistent with various disclosed embodiments in the present disclosure.

In some other embodiments as shown in FIG. 1 to FIG. 5, FIG. 6 which is a top view of the first connection board in FIG. 4, and FIG. 8 which is another cross-sectional view along the A-A' direction in FIG. 6, along the direction Z1 from the second region 4011Y to the first region 4011X, the thickness of the first sub-section 4011A in the direction X from the first sub-section 4011A to the second sub-section 4011B may increase first, then remain unchanged, and then decrease.

Along the direction Z1 from the second region 4011Y to the first region 4011X, the thickness of the second sub-section 4011B in the direction X from the first sub-section 4011A to the second sub-section 4011B may increase first, then remain unchanged, and then decrease.

In the direction X from the first sub-section 4011A to the second sub-section 4011B, a region where the thickness of the first sub-section 4011A and the second sub-section 4011B increases may be a first sub-section 4011Y1, and a region where the thicknesses of the first sub-section 4011A and the second sub-section 4011B remain unchanged may be a second sub-region 4011Y2.

The first insulating layer 50 may be coated on the first sub-section 4011A of the first sub-region 4011Y1, and the first insulating layer 50 may be coated on the second sub-section 4011B of the first sub-region 4011Y1.

In the present embodiment, the first insulating layer 50 coated on the first pin 4011 may be only located on the first sub-section 4011A of a portion of the second region 4011Y the first insulating layer 50 coated on the first pin 4011 may be only located on the first sub-section 4011A of a portion of the second region 4011Y, or the first insulating layer 50 coated on the first pin 4011 may be only located on the first sub-section 4011A and the second sub-section 4011B of a portion of the second region 4011Y. Along the direction Z1 from the second region 4011Y to the first region 4011X, that is, along the vertical direction from top to bottom in FIG. 8, the thickness of the first sub-section 4011A in the direction X from the first sub-section 4011A to the second sub-section 4011B may increase first, then remain unchanged, and then decrease. Along the direction Z1 from the second region 4011Y to the first region 4011X, that is, along the vertical direction from top to bottom in FIG. 8, the thickness of the second sub-section 4011B in the direction X from the first sub-section 4011A to the second sub-section 4011B may increase first, then remain unchanged, and then decrease. The two independent sub-sections of the first pin 4011 each may include a slope area and a vertical area. In this embodiment, the first insulating layer 50 may be coated only on the first sub-section 4011A of the first sub-region 4011Y1 of the slope area, and may be only coated on the second sub-section 4011B of the first sub-region 4011Y1 in the slope area. The lower end of a charged second pin 4021 of the plurality of second pins 4021 may first contact the surface of the slope area of the first sub-section 4011A and/or the second sub-section 4011B of the corresponding first pin 4011. Therefore, in the present embodiment, the first insulating layer 50 may be coated on the first sub-section 4011A of the first sub-region 4011Y1, and the first insulating layer 50 may be coated on the second sub-section 4011B of the first sub-region 4011Y1. Correspondingly, it may be ensured that the final contact range between the first pin 4011 and the corresponding second pin 4021 is large enough to ensure the stability of the electrical connection between the first connection board 401 and the second connection board 402. Further, even when misplaced and plugged, the first insulating layer 50 on the surface of the first sub-section 4011A and/or the surface of the second sub-section 4011B of the first sub-region 4011Y1 may play the role of electrostatic protection to avoid the electrostatic breakdown induced by instantaneous connection and conduction between the first pin 4011 and the corresponding second pin 4021, thereby preventing electrostatic damage to the display panel 10 during the plug and unplug of the connector 40 with electricity. Further, the first insulation layer 50 may be only coated on the first pin 4011 in the first sub-region 4011Y1, to save the coating material of the first insulating layer 50 and reduce cost.

For description purposes only, the previous embodiment with the first sub-section 4011A and the second sub-section 4011B of the first pin 4011 is used as an example to illustrate the present disclosure, and does not limit the scope of the present disclosure. In various embodiments, the structure of the first pin 4011 may be any suitable structures as long as the corresponding second pin 4021 first contacts the portion of the first pin 4011 coated with the first insulating layer 50 when the first connection board 401 and the second connection board 402 are plugged and connected for electrostatic protection.

As shown in FIGS. 1-5, FIG. 6 and FIG. 7, in one embodiment, the first insulating layer 50 may be coated on the first sub-section 4011A of the second sub-region 4011Y2, and/or, the first insulating layer 50 may be coated on the second sub-section 4011B of the second sub-region 4011Y2.

Specifically, the first insulating layer 50 coated on the first pin 4011 may only be located on the surface of the first sub-section 4011A of a partial area of the second region 4011Y, or the first insulating layer 50 may only be located on the surface of the second sub-section 4011B of a partial area of the second region 4011Y, or the first insulating layer 50 may be located on the surfaces of the first sub-section 4011A and the second sub-section 4011B of only a partial area of the second region 4011Y. Along the direction Z1 from the second region 4011Y to the first region 4011X, that is, along the vertical direction from top to bottom in FIG. 8, the thickness of the first sub-section 4011A in the direction X from the first sub-section 4011A to the second sub-section 4011B may increase first, then remain unchanged, and then decrease. Along the direction Z1 from the second region 4011Y to the first region 4011X, that is, along the vertical direction from top to bottom in FIG. 8, the thickness of the second sub-section 4011B in the direction X from the first sub-section 4011A to the second sub-section 4011B may increase first, then remain unchanged, and then decrease. The two independent sub-sections of the first pin 4011 each may include a slope area and a vertical area. In this embodiment, the first insulating layer 50 may be coated on the first sub-section 4011A of the first sub-region 4011Y1 in the slope area and the second sub-region 4011Y2 in the vertical area, and may be coated the second sub-section 4011B of the first sub-region 4011Y1 in the slope area and the second sub-region 4011Y2 in the vertical area. The lower end of a charged second pin 4021 of the plurality of second pins 4021 may first contact the surfaces of the slope area and the vertical area of the first sub-section 4011A and/or the second sub-section 4011B of the corresponding first pin 4011, when the second connection board 402 is plugged into the first connection board 401 downward. Therefore, in the present embodiment, the first insulating layer 50 may be coated on the first sub-section 4011A of the first sub-region 4011Y1 and the second sub-region 4011Y2, and/or on the second sub-section 4011B of the first sub-region 4011Y1 and the second sub-region 4011Y2. Therefore, when misplaced and plugged, the first insulating layer 50 on the surface of the first sub-section 4011A and/or the surface of the second sub-section 4011B of the first sub-region 4011Y1 and the second sub-region 4011Y2 may play the role of electrostatic protection to avoid the electrostatic breakdown induced by instantaneous connection and conduction between the first pin 4011 and the corresponding second pin 4021, thereby preventing electrostatic damage to the display panel 10 during the plug and unplug of the connector 40 with electricity.

In some optional embodiments, as shown in FIG. 1 to FIG. 8, the first insulating layer 50 may be made of a material including a metal chelate compound.

Specifically, the first insulating layer 50 may be made of a material including a metal chelate compound. Optionally, in one embodiment, in terms of cost, ease of acquisition, etc., the first insulating layer 50 may be made of an aluminum chelate compound. Metal chelate compounds may be easily obtained by reacting metal alkoxides with chelating agents. In the present disclosure, the first insulating layer 50 may be made of a metal chelate compound, which may improve the adhesion with the metal conductive material of the first pin 4011 in a small area and avoid the falling off of the first insulating layer 50 on the first pin 4011 when the coating area is small. The coating firmness between the first insulating layer 50 and the first pin 4011 may be ensured.

Optionally, in this embodiment, the thickness of the first insulating layer 50 may be about 0.04 mm to 0.1 mm. When the first insulating layer 50 is made of a metal chelate compound, the coating thickness of the first insulating layer 50 may be ensured to be thin only between about 0.04 mm-0.1 mm, and the coating firmness between the first insulating layer 50 and the first pin 4011 may be improved. Further, the first insulating layer 50 may be prevented from occupying the plugging space between the first pin 4011 and the corresponding second pin 4021.

Figure 9:
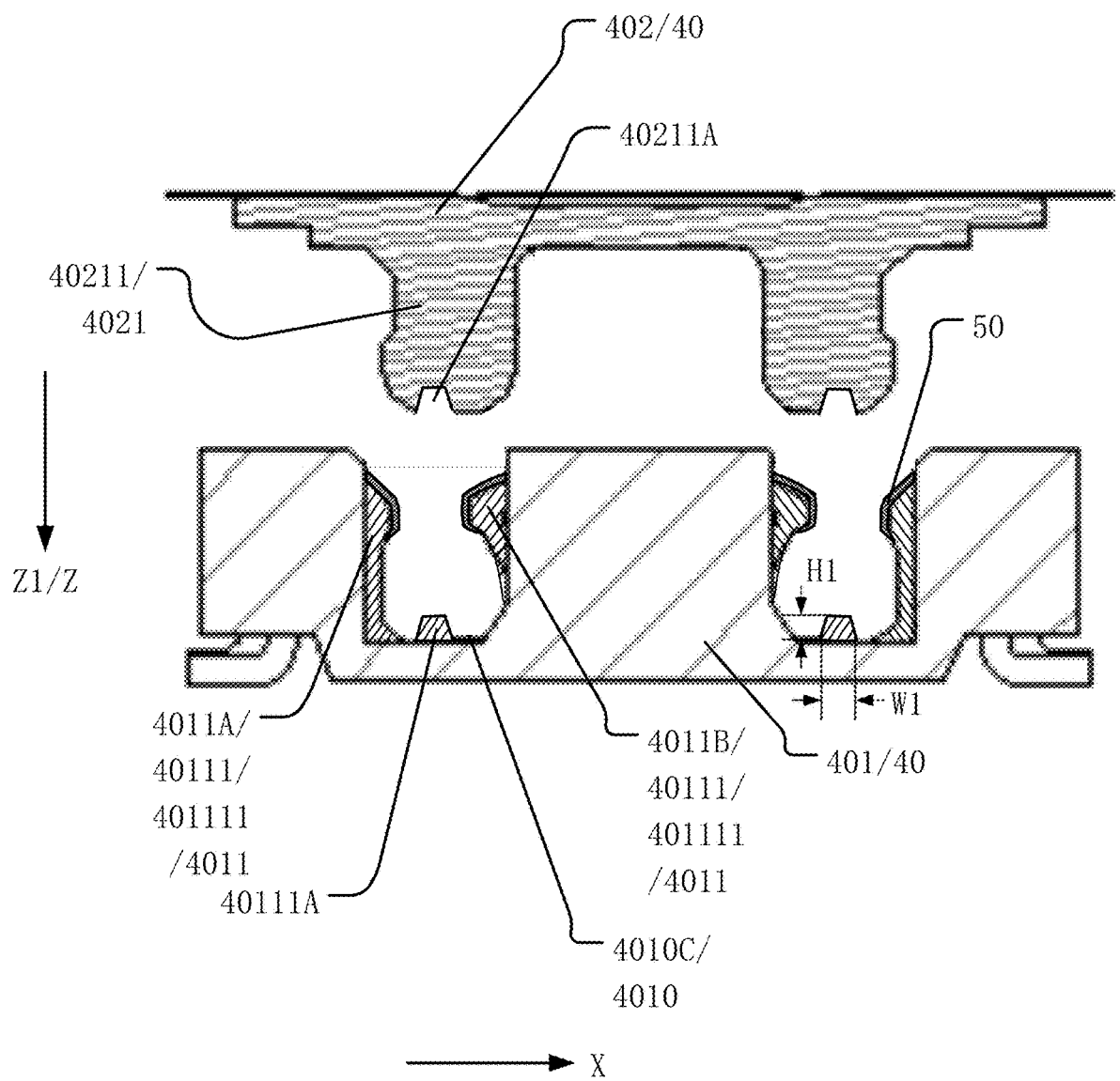
FIG. 9 illustrates an exploded view of cross-section structures of a portion of first sub-pins and second sub-pins in a connector in FIG. 2 consistent with various disclosed embodiments in the present disclosure.
Figure 10:
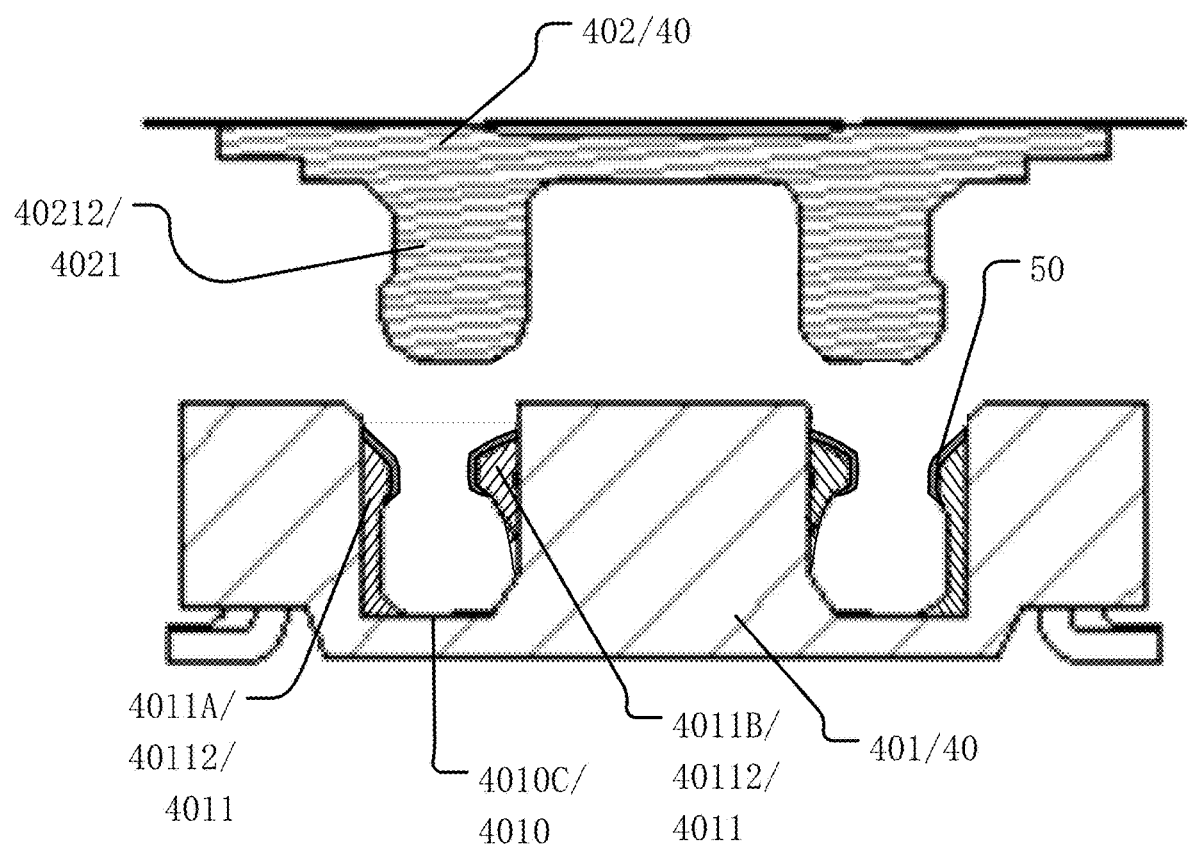
FIG. 10 illustrates an exploded view of cross-section structures of a third sub-pin and a fourth sub-pin in a connection in FIG. 2 consistent with various disclosed embodiments in the present disclosure.

In some other embodiments, as shown in FIG. 1, FIG. 2, FIG. 9 which is a schematic exploded view of the cross-sectional structure of a first sub-pin and a second sub-pin of the connector in FIG. 2, and FIG. 10 which is a schematic exploded structure of the cross-sectional structure of a third sub-pin and a fourth sub-pin of the connector in FIG. 2, the plurality of first pins 4011 may at least include a first sub-pin 40111 and a third sub-pin 40112. The type of signal connected to the first sub-pin 40111 may be different from the type of the signal connected to the third sub-pin 40112.

The plurality of second pins 4021 may at least include a second sub-pin 40211 and a fourth sub-pin 40212. The type of signal connected to the second sub-pin 4021 may be different from the type of signal connected to the fourth sub-pin 40212.

The second sub-pin 40211 may be connected to the first sub-pin 40111 correspondingly, and the fourth sub-pin 40212 may be connected to the third sub-pin 40112 correspondingly.

As shown in FIG. 9 and FIG. 10, the shape of the first sub-pin 40111 may be different from the shape of the third sub-pin 40112.

In the present embodiment, in the first connection board 401 of the connector 40, the plurality of first pins 4011 may be designed with different shapes. Specifically, the plurality of first pins 4011 may at least include the first sub-pin 40111 and the third sub-pin 40112, and the signals connected to the first sub-pin 40111 may be different from the type of the signal connected to the third sub-pin 40112. That is, the plurality of first pins 4011 may include at least two types of different signal pins. The plurality of second pins 4021 in the second connection board 402 may include at least the second sub-pin 40211 corresponding and connected to the first sub-pin 40111 and the fourth sub-pin 40212 corresponding and connected to the third sub-pin 40112. The plurality of first pins 4011 may be designed with different shapes, and the plurality of second pins 4021 may also be designed with different shapes. Therefore, when the first connection board 401 and the second connection board 402 are plugged and there is a misplaced insertion, the second sub-pin 40211 may not correspond to the position of the first sub-pin 40111, the fourth sub-pin 40212 may correspond to the position of the first sub-pin 40111; the fourth sub-pin 40212 may not correspond to the position of the third sub-pin 40112 and the second sub-pin 40211 may correspond to the position of the third sub-pin 40112. Correspondingly, the first sub-pin 40111 on the first connection board 401 and the fourth sub-pin 40212 on the second connection board 402 which do not match in shape may not be able to form a plug-in structure. That is, the fourth sub-pins 40212 may not be able to be plugged into the positions of the first sub-pins 40111 embedded in the grooves 4010, thereby avoiding the misaligned plugging of the first connection board 401 and the second connection board 402.

The present disclosure does not specifically limit the shape of the first sub-pin 40111 and the shape of the third sub-pin 40112 on the first connection board 401, as long as the shapes of the first sub-pin 40111 on the first connection board 401 and the third sub-pins 40112 on the second connection board 402 are different and cannot match when the first connection board 401 and the second connection board 402 are plugged downward.

Optionally, in one embodiment, the display panel 10 may include light-emitting elements (not shown in the figure), and the light-emitting elements may be understood as sub-pixels, organic light-emitting elements, or micro-light-emitting elements, which is not limited in this embodiment. The light-emitting elements may be connected to a first power supply signal for providing the light-emitting element with a power supply signal for driving light-emitting. For example, the first power supply signal may be a high-voltage power supply signal. The flexible circuit board 20 and the printed circuit board 30 may be connected to a second power supply signal for providing the flexible circuit board 20 and the printed circuit board 30 with a power supply signal for driving operation. The display panel 10 may also be a touch display panel including a touch structure, that is, the display panel 10 may include touch electrodes (not shown in the figure), and the touch electrodes may be connected to touch drive signals for providing touch electrodes with touch drive signal for the touch-control function. The signals of the first sub-pin 40111 on the first connection board 401 and/or the second sub-pin 40211 on the second connection board 402 with the shape-differentiated design in this embodiment may include any one of the first power signal, the second power signal and the touch driving signal. Since the first power signal, the second power signal, and the touch driving signal are all high-voltage driving signals, in this embodiment, the signal connected to the sub-pins of the connector 40 with shape-differentiated design may be configured to be the high-voltage driving signal. Therefore, the sub-pins connected to the high-voltage signal may be prevented from being damaged by high voltage when the connection board is misaligned and plugged, thereby further reducing the damage to the connector 40.

In some embodiments, as shown in FIG. 1, FIG. 2, FIG. 9 and FIG. 10, a first protrusion 40111A may be disposed at a position on the groove bottom 4010C corresponding to the first sub-pin 40111.

A side surface of the second sub-pin 40211 facing the first sub-pin 40111 may be provided with a first groove 40211A.

The first protrusion 40111A may be plugged into and connected to the first groove 40211A, and the first protrusion 40111A and the first groove 40211A may be matched with each other.

Figure 11:
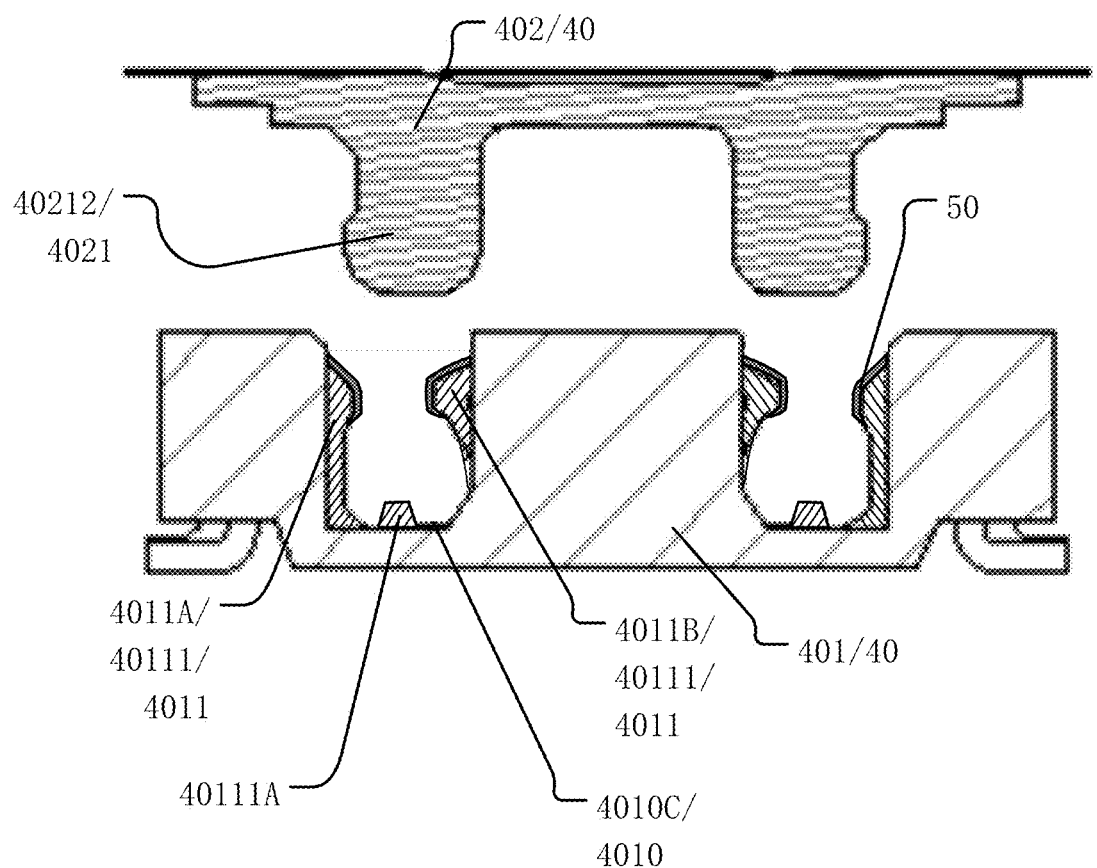
FIG. 11 illustrates a schematic structure when the first connection board and the second connection board in FIG. 9 and FIG. 10 are misaligned and plugged consistent with various disclosed embodiments in the present disclosure.
Figure 12:
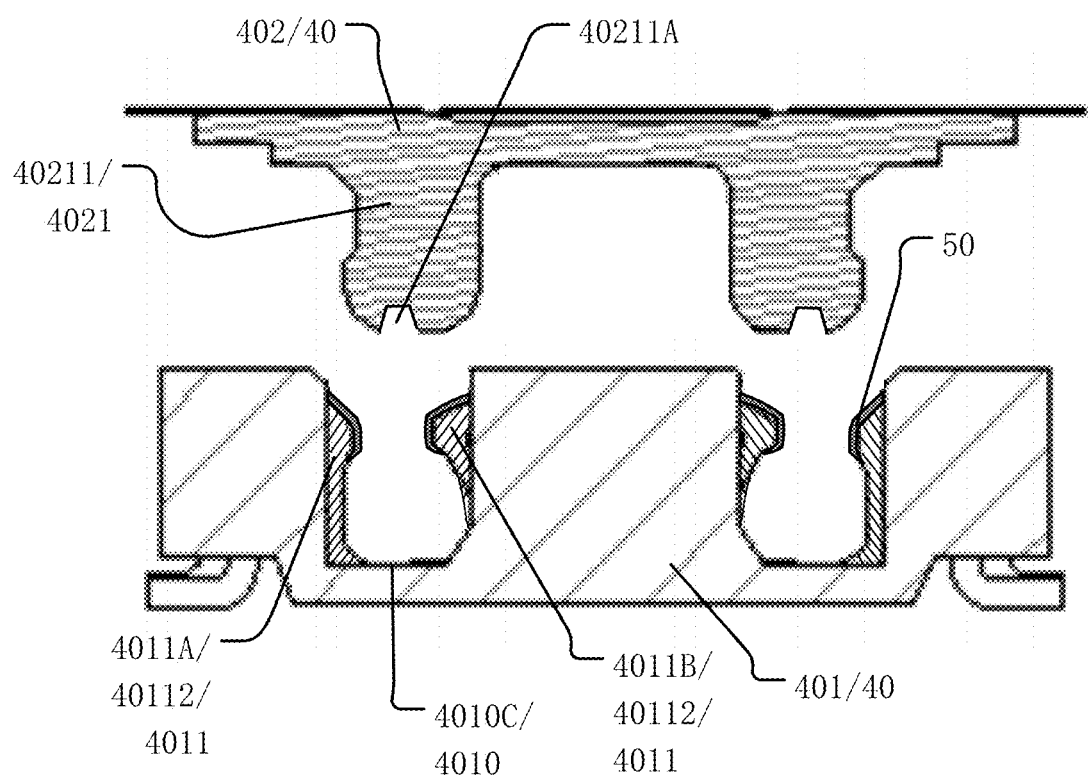
FIG. 12 illustrates another schematic structure when the first connection board and the second connection board in FIG. 9 and FIG. 10 are misaligned and plugged consistent with various disclosed embodiments in the present disclosure.

Optionally, in some embodiments, the shapes of the third sub-pin 40112 and the fourth sub-pin 40212 in this embodiment may not include matching protrusion and groove structures, and may be the structure of the pins in the existing technologies. That is, the groove bottom 4010C at the corresponding position of the three sub-pins 40112 may be a flat surface, and the surface of the fourth sub-pin 40212 facing the first sub-pin 40111 may be also a flat surface. When the first connection board 401 and the second connection board 401 are blindly buckled and there is a misaligned plugging, the fourth sub-pin 40212 on the flat surface may be supported by the first protrusion 40111A included in the groove bottom 4010C at the position corresponding to the first sub-pin 40111, as shown in FIG. 11 which is a schematic diagram of the structure when the first connection board and the second connection board in FIG. 9 and FIG. 10 are dislocated and plugged, and FIG. 12 which is another schematic diagram of the structure when the first connection board and the second connection board in FIG. 9 and FIG. 10 are dislocated and plugged. When the first connection board 401 and the second connection board 402 are misaligned and plugged, the first protrusion 40111A on the first sub-pin 40111 of the first connection board 401 that is easily damaged with a connected high-voltage signal may support the fourth sub-pin 40212 without the first groove 40211A (as shown in FIG. 11), and the second sub-pin 40211 on the second connection board 402 that is easily damaged with a connected high-voltage signal and the third sub-pin 40112 on the first connection board 401 may be suspended in the air (as shown in FIG. 12) because of the existence of the first groove 40211A and the support of the first protrusion 40111A. That is, the vulnerable second sub-pin 40211 connected to the high-voltage signal on the misplaced second connection board 402 may not contact the third sub-pin 40112 on the first connection board 401, and thus may not be electrically conductive. It may avoid the problem of electrostatic damage caused by the conduction of the vulnerable sub-pins that are connected to the high-potential signal instantly when being wrong plugged, and improve the electrostatic protection effect of the display module 000.

In the present disclosure, the shapes of the first protrusion 40111A and the first groove 40211A are not specifically limited. In one embodiment, the shape of the first protrusion 40111A may be a trapezoid as shown in FIG. 9. In some other optional embodiments, the shape of the first protrusion 40111A may be any one or more of a cone, an ellipse, a circle, a triangle, a square, or a rectangle, as long as the groove bottom 4010C at the position corresponding to the first sub-pin 40111 includes the first protrusion 40111A. The first sub-pin 40111 and the third sub-pin 40112 may be designed differently, the shape of the first protrusion 40111A may match the shape of the first groove 40211A, and when the first sub-pin 40111 and the second sub-pin are plugged in, the first protrusions 40111A may be plugged into the first grooves 40211A.

In some other embodiments, as shown in FIG. 1, FIG. 2, FIG. 9, and FIG. 13 which is another schematic exploded view of the cross-sectional structure of a first sub-pin and a second sub-pin of the connector in FIG. 2, the plurality of first pins may include a plurality of first sub-pins 4-111, and the plurality of first sub-pins 40111 may at least include a first-type first sub-pin 401111 and a second-type first sub-pin 401112. The signal connected to the first-type first sub-pin 401111 may be different from the signal connected to the second-type first sub-pin 401112.

The shape of the first-type first sub-pin 401111 may be different from the shape of the second-type first sub-pin

401112. Optionally, the shape of the first protrusions 40111A corresponding to the first-type first sub-pins 401111 may be different from the shape of the first protrusions 40111A corresponding to the second-type first sub-pins 401112.

Figure 13:
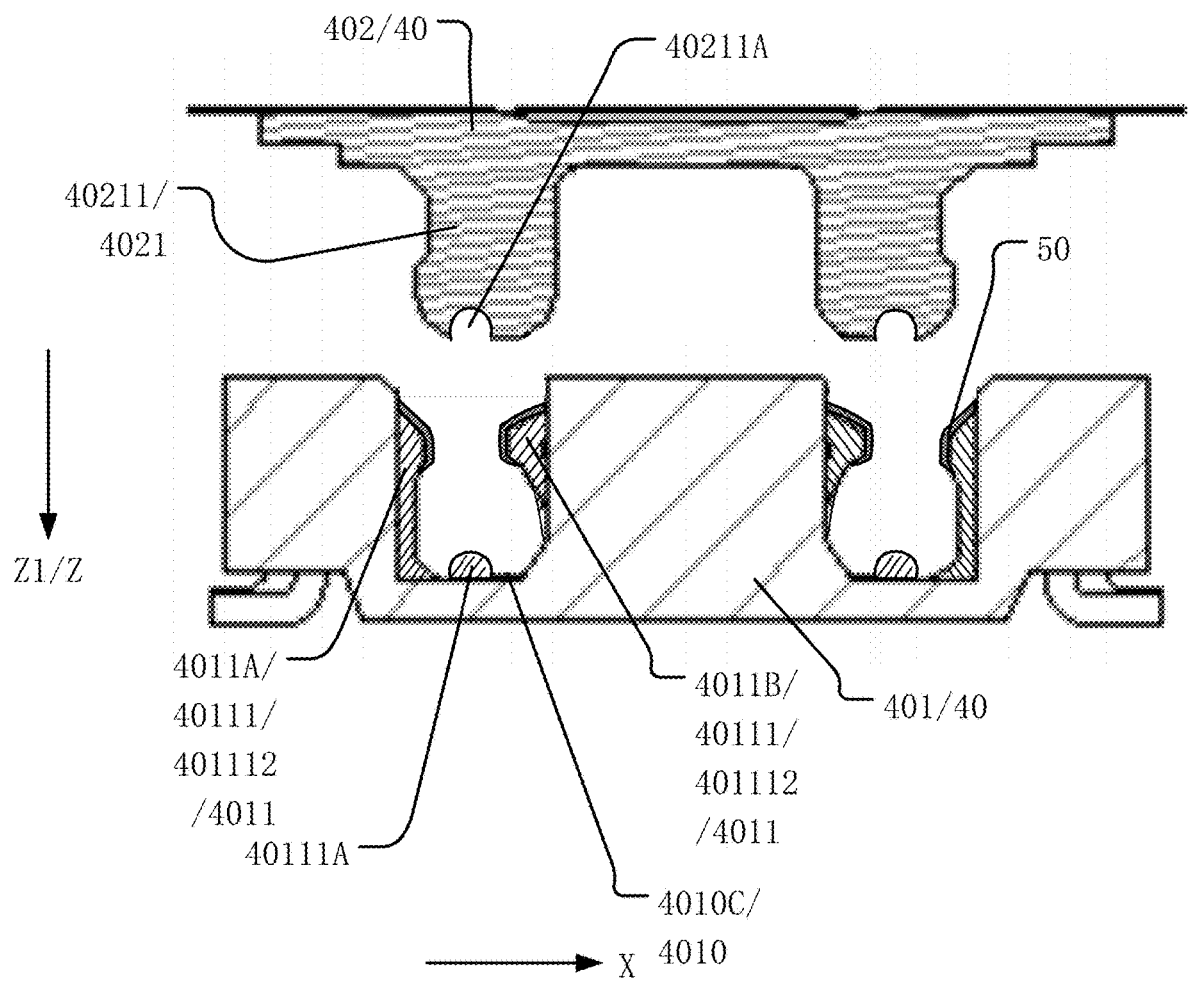
FIG. 13 illustrates another exploded view of cross-section structures of a portion of first sub-pins and second sub-pins in a connector in FIG. 2 consistent with various disclosed embodiments in the present disclosure.
Figure 14:
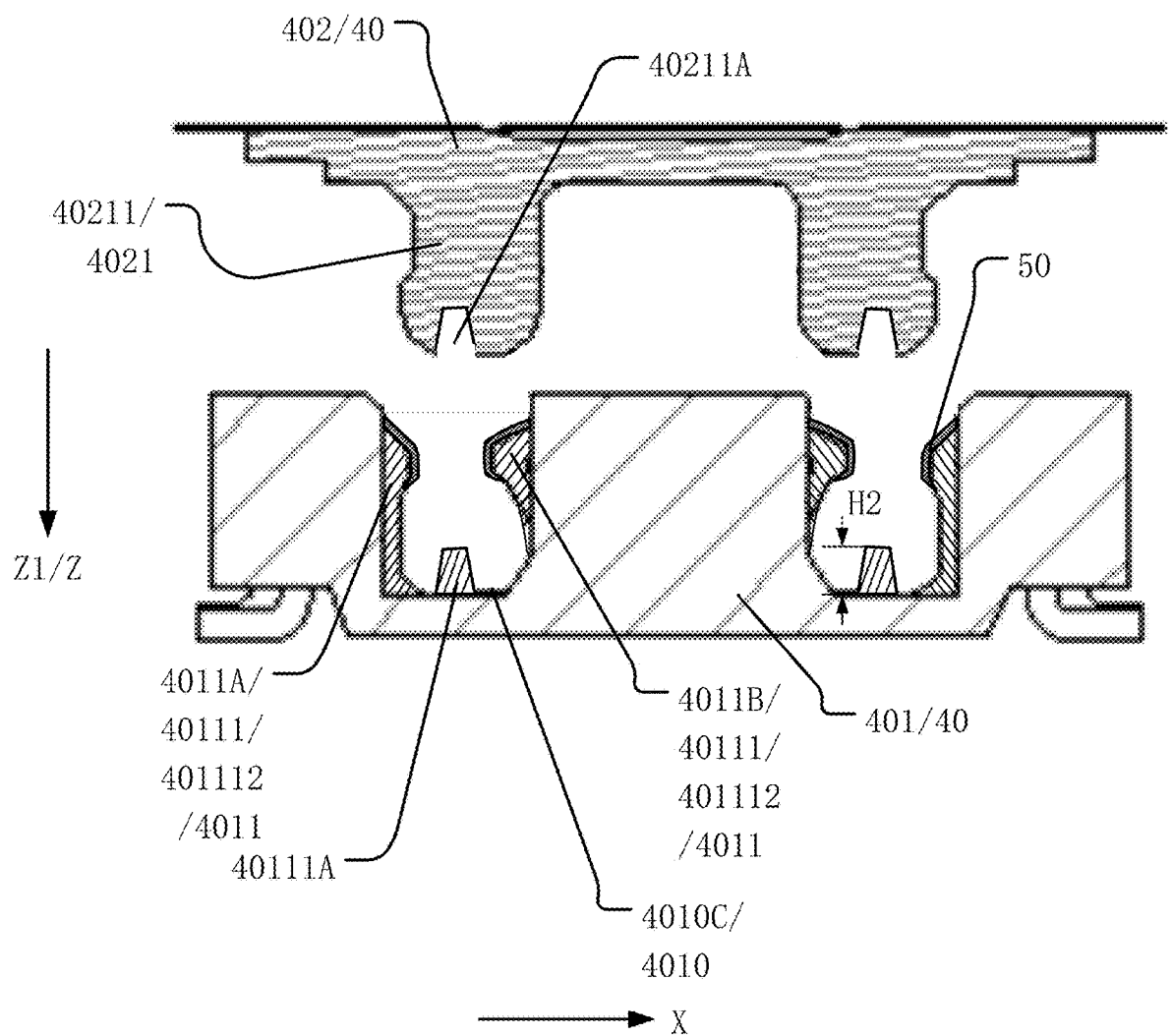
FIG. 14 illustrates another exploded view of cross-section structures of a portion of first sub-pins and second sub-pins in a connector in FIG. 2 consistent with various disclosed embodiments in the present disclosure.
Figure 15:
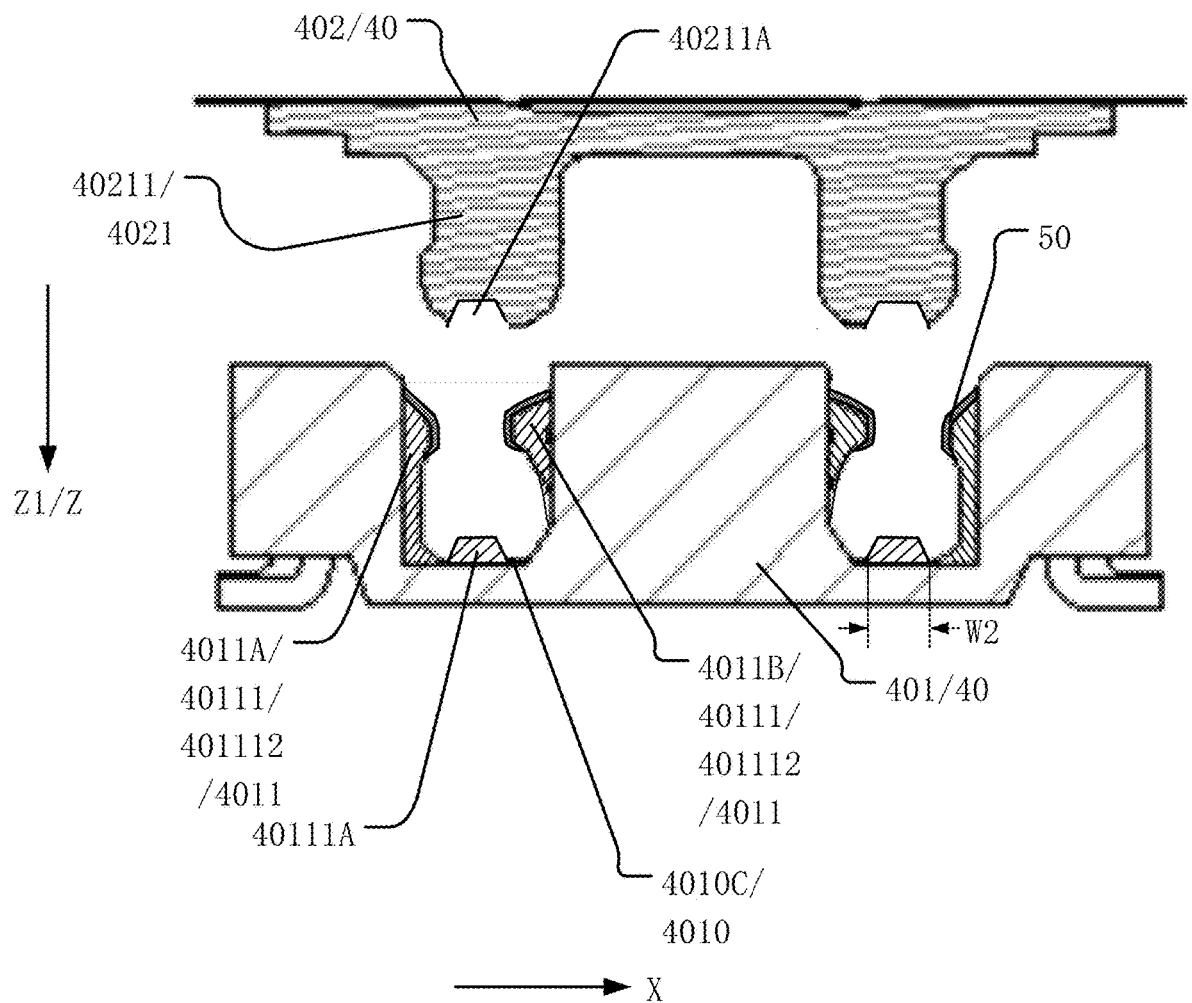
FIG. 15 illustrates another exploded view of cross-section structures of a portion of first sub-pins and second sub-pins in a connector in FIG. 2 consistent with various disclosed embodiments in the present disclosure.

Specifically, in the present embodiment, the plurality of first sub-pins 40111 that are easily damaged by static electricity connected to high-voltage signals may also be designed with different shapes. For example, the plurality of first sub-pins 40111 may at least include the first-type first sub-pin 401111 and the second-type first sub-pin 401112. The signal connected to the first-type first sub-pin 401111 may be different from the signal connected to the second-type first sub-pin 401112. Optional, the signal connected to the first-type first sub-pin 401111 may be one of the first power signal, the second power signal, or the touch driving signal among the high-voltage signals, and the signal connected to the second-type first sub-pin 401112 may be other one of the first power signal, the second power signal, or the touch driving signal among the high voltage signals. The shape of the first-type first sub-pin 401111 may be different from the shape of the second-type first sub-pin 401112. As shown in FIG. 9 and FIG. 13, the shape of the first protrusions 40111A corresponding to the first-type first sub-pins 401111 may be a trapezoid, and the shape of the first protrusions 40111A corresponding to the second-type first sub-pins 401112 may be a semicircle. In some other embodiments as shown in FIG. 1, FIG. 2, FIG. 9, and FIG. 14 which is another schematic exploded view of the cross-sectional structure of a first sub-pin and a second sub-pin of the connector in FIG. 2, the shape of the first-type first sub-pin 401111 may be different from the shape of the second-type first sub-pin 401112. Along the direction Z perpendicular to the first connection board 401, a height H1 of the first protrusion 40111A corresponding to the first-type first sub-pin 401111 may be different form a height H2 of the first protrusion 40111A corresponding to the second-type first sub-pin 401112. In some other embodiments as shown in FIG. 1, FIG. 2, FIG. 9, and FIG. 15 which is another schematic exploded view of the cross-sectional structure of a first sub-pin and a second sub-pin of the connector in FIG. 2, the shape of the first-type first sub-pin 401111 may be different from the shape of the second-type first sub-pin 401112. Along the direction X parallel to the plane of the first connection board 401, the width W1 of the first protrusion 40111A corresponding to the first-type first sub-pin 401111 may be different from the width W1 of the first protrusions 40111A corresponding to the second-type first sub-pins 401112. Therefore, the shapes of the first protrusions 40111A of the first sub-pins 40111 connected to different high-voltage signals may be designed differently, to differentiate the first sub-pins 40111 connected to different high-voltage signals. The connection accuracy between the first connection board 401 and the second connection board 402 may be improved.

In some embodiments, as shown in FIG. 1, FIG. 2, FIG. 9, and FIG. 16 which is another schematic exploded view of the cross-sectional structure of a third sub-pin and a fourth sub-pin of the connector in FIG. 2, a second groove 40112B may be disposed at a position on the groove bottom 4010C corresponding to the third sub-pin 40112, and, a first protrusion 40111A may be disposed at a side surface of the fourth sub-pin 40212 facing the third sub-pin 40112.

The third protrusion 40212B may be plugged into and connected to the second groove 40112B, and third protrusion 40212B and the second groove 40112B may be matched with each other.

Figure 16:
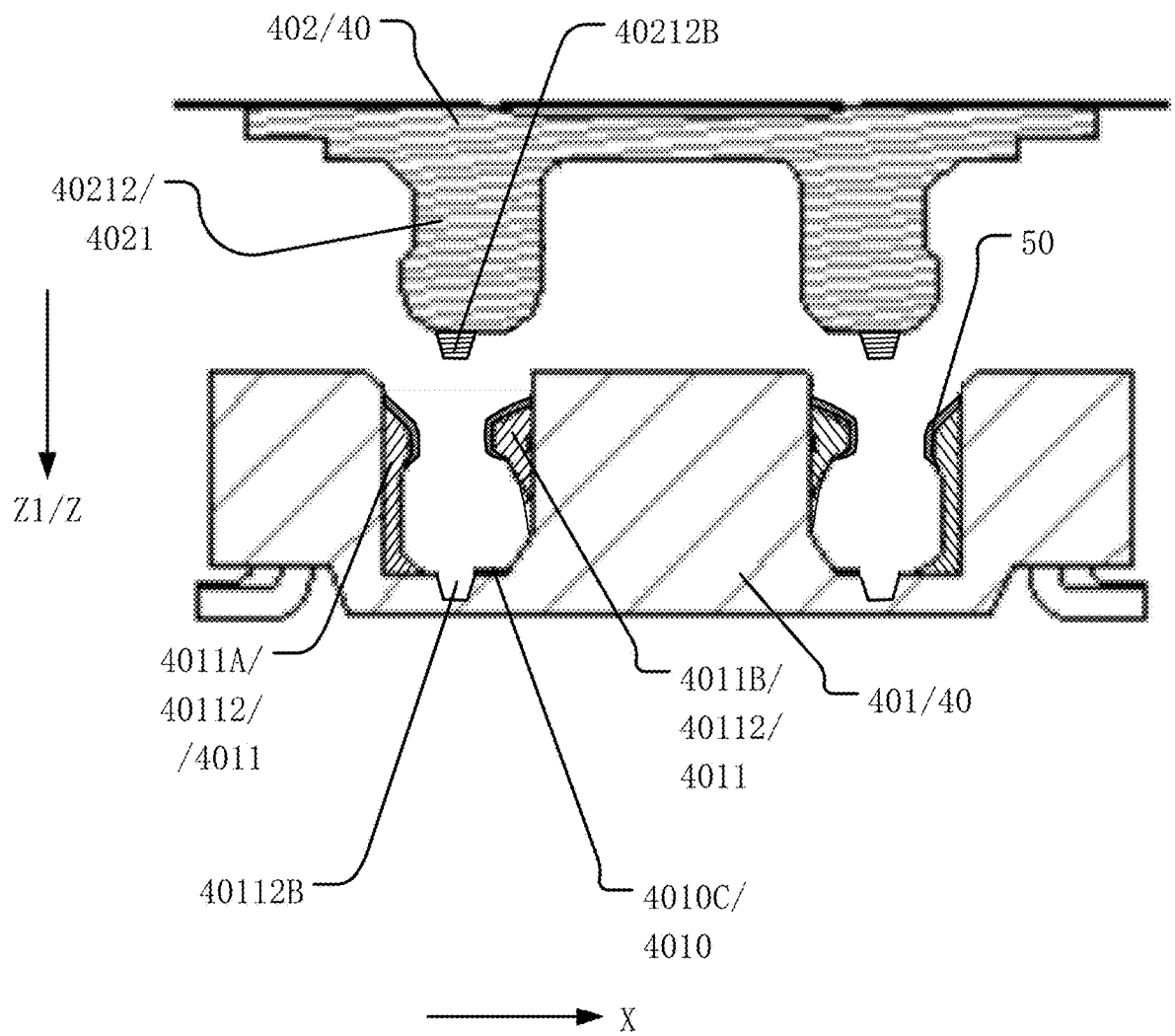
FIG. 16 illustrates another exploded view of cross-section structures of a portion of third sub-pins and fourth sub-pins in a connector in FIG. 2 consistent with various disclosed embodiments in the present disclosure.
Figure 17:
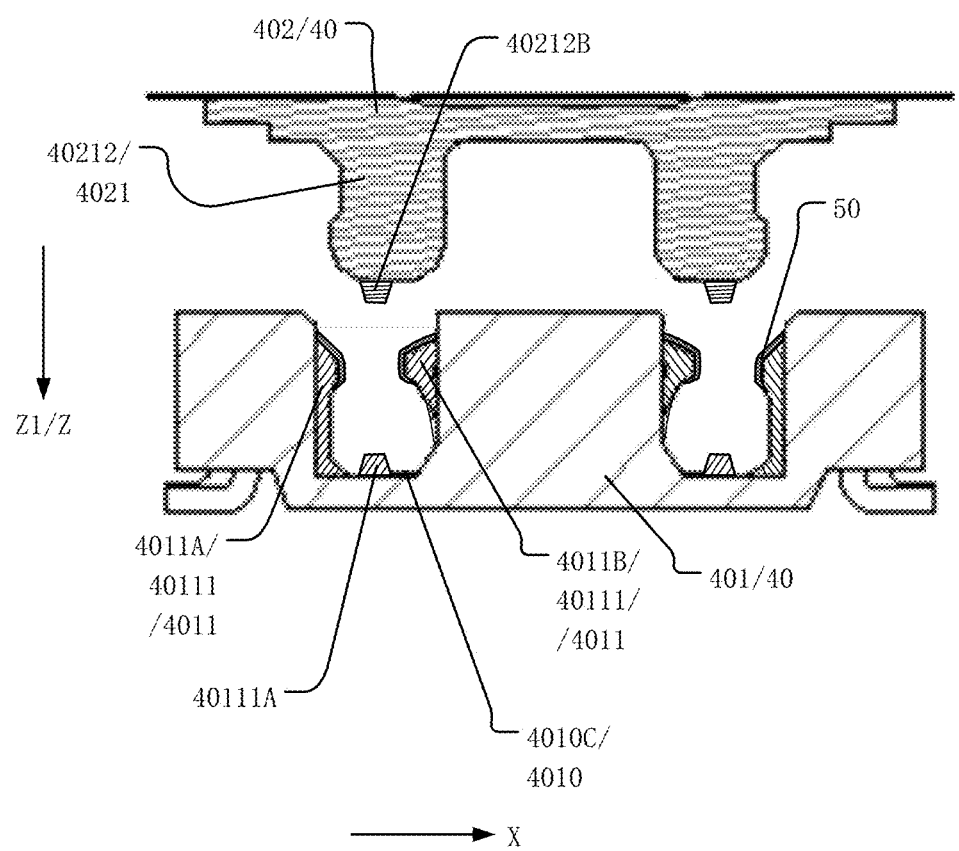
FIG. 17 illustrates a schematic structure when the first connection board and the second connection board in FIG. 9 and FIG. 16 are misaligned and plugged consistent with various disclosed embodiments in the present disclosure.
Figure 18:
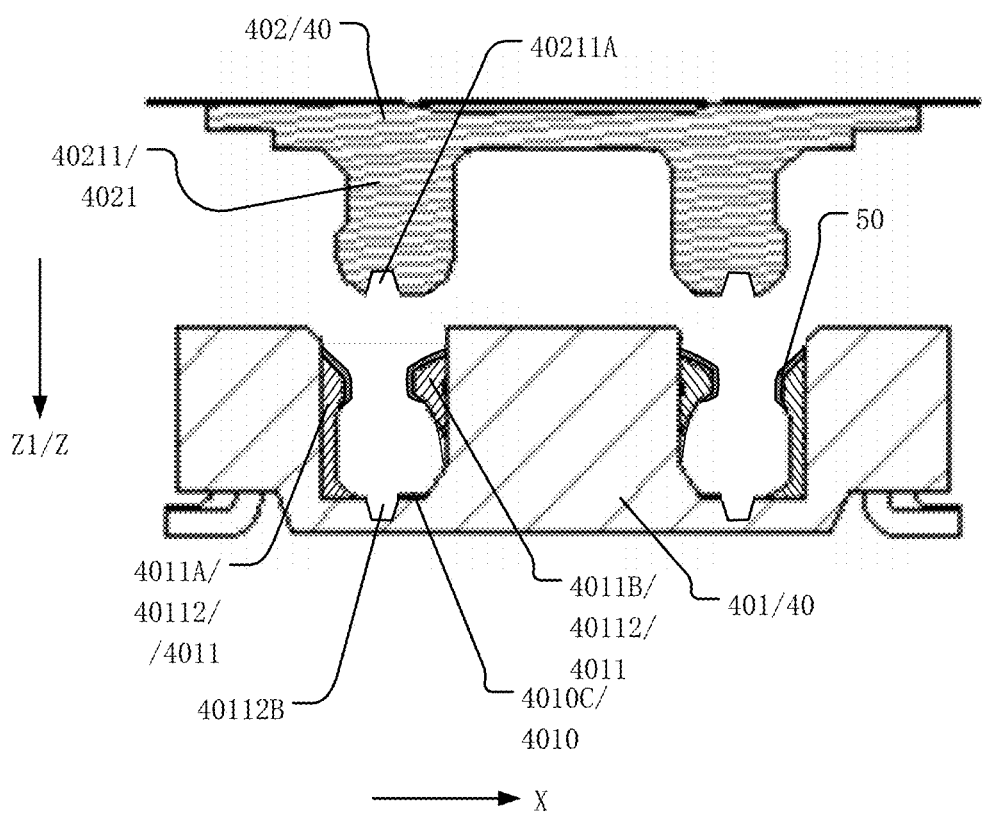
FIG. 18 illustrates another schematic structure when the first connection board and the second connection board in FIG. 9 and FIG. 16 are misaligned and plugged consistent with various disclosed embodiments in the present disclosure.

Specifically, the signals connected to the third sub-pin 40112 of the first connection board 401 and the fourth sub-pin 40212 of the second connection board 402 correspondingly plugged with the first connection board 401 may be low-voltages, and the third sub-pin 40112 of the first connection board 401 and the fourth sub-pin 40212 of the second connection board 402 may be sub-pins that are not easily damaged by static electricity. The shape of the third sub-pin 40112 and the fourth sub-pin 40212 may also include matching groove and protrusion. That is, the second groove 40112B may be disposed at the position on the groove bottom 4010C corresponding to the third sub-pin 40112, and the first protrusion 40111A may be disposed at the side surface of the fourth sub-pin 40212 facing the third sub-pin 40112. When the first connection board 401 and the second connection board 401 are correctly plugged, the first protrusion 40111A of the first sub-pin 40111 may be plugged into the first groove 40211A of the second sub-pin 40211, and the second groove 40112B of the third sub-pin 40112 may be plugged into the second protrusion 40212B of the fourth sub-pin 40212. When the first connection board 401 and the second connection board 401 are blindly buckled and there is a misaligned plugging, the fourth sub-pin 40212 with the second protrusion 40212B may be supported by the first protrusion 40111A included in the groove bottom 4010C at the position corresponding to the first sub-pin 40111, as shown in FIG. 17 which is a schematic diagram of the structure when the first connection board and the second connection board in FIG. 9 and FIG. 16 are dislocated and plugged, and FIG. 18 which is another schematic diagram of the structure when the first connection board and the second connection board in FIG. 9 and FIG. 16 are dislocated and plugged. When the first connection board 401 and the second connection board 402 are misaligned and plugged, the first protrusion 40111A on the first sub-pin 40111 of the first connection board 401 that is easily damaged with a connected high-voltage signal may support the fourth sub-pin 40212 with the second protrusion 40212B (as shown in FIG. 17), and the second sub-pin 40211 on the second connection board 402 that is easily damaged with a connected high-voltage signal and the third sub-pin 40112 on the first connection board 401 may be suspended in the air (as shown in FIG. 18) because of the existence of the first groove 40211A and the second groove 40112B, and also the support of the first protrusion 40111A and the second protrusion 40212B. That is, the vulnerable second sub-pin 40211 connected to the high-voltage signal on the misplaced second connection board 402 may not contact the third sub-pin 40112 on the first connection board 401, and thus may not be electrically conductive. It may avoid the problem of electrostatic damage caused by the conduction of the vulnerable sub-pins that are connected to the high-potential signal instantly when being wrong plugged, and improve the electrostatic protection effect of the display module 000.

Figure 19:
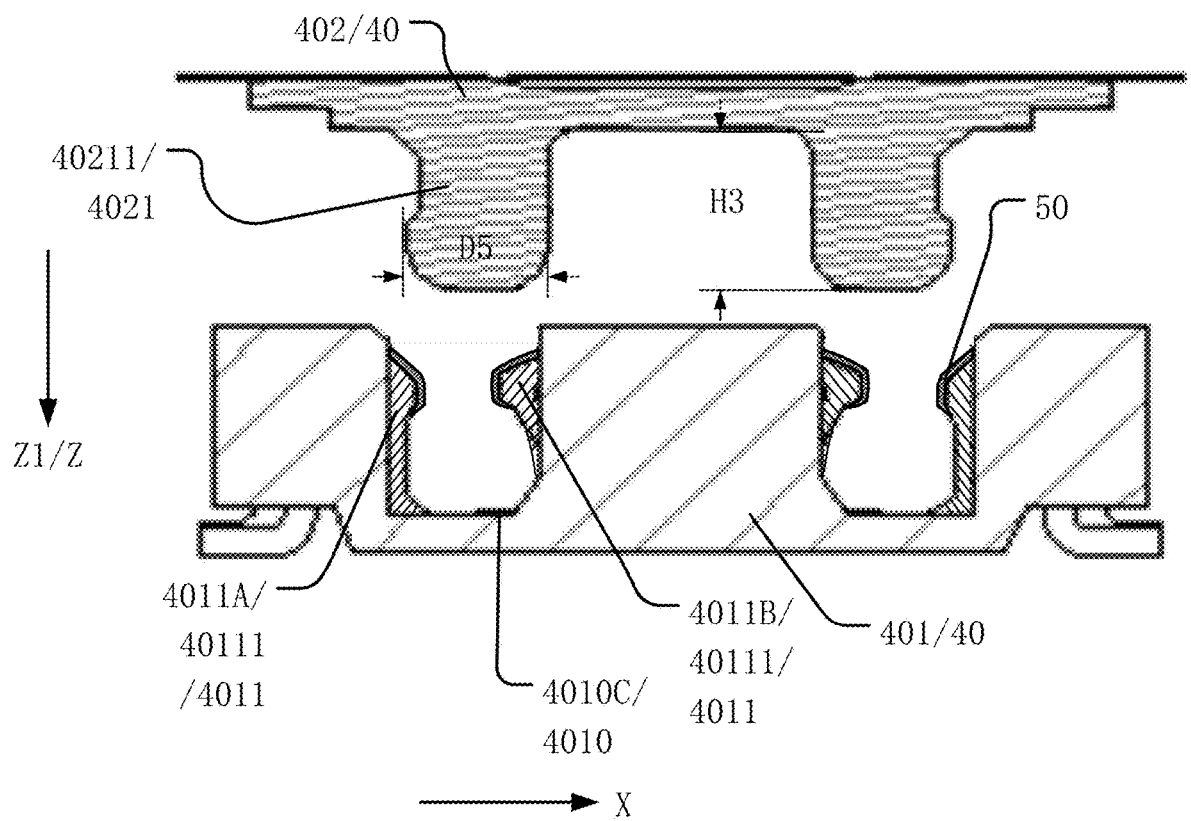
FIG. 19 illustrates another exploded view of cross-section structures of a portion of first sub-pins and second sub-pins in a connector in FIG. 2 consistent with various disclosed embodiments in the present disclosure.
Figure 20:
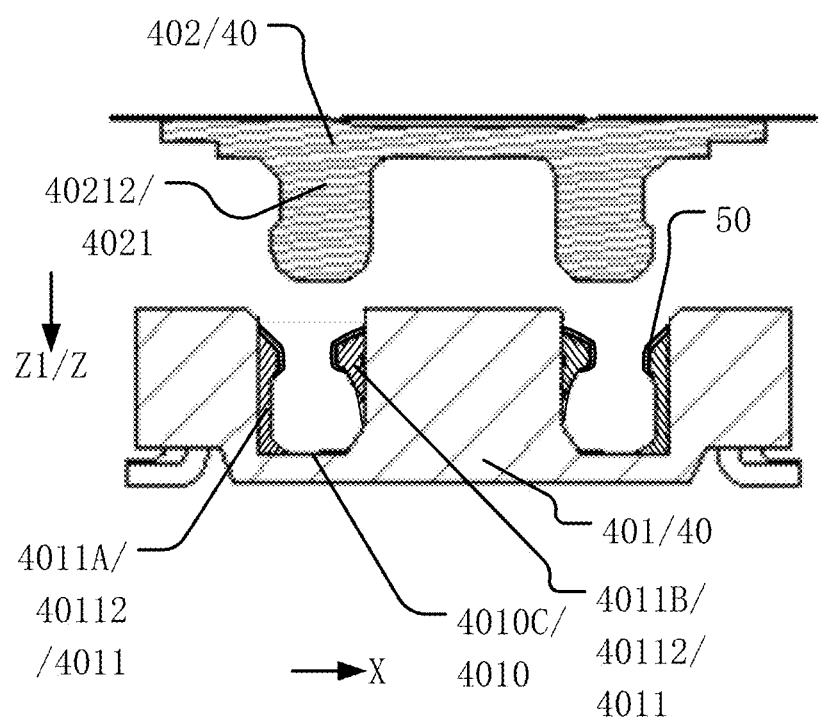
FIG. 20 illustrates another exploded view of cross-section structures of a portion of third sub-pins and fourth sub-pins in a connector in FIG. 2 consistent with various disclosed embodiments in the present disclosure.

In some embodiments, as shown in FIG. 1, FIG. 2, FIG. 19 which is another schematic exploded view of the cross-sectional structure of a first sub-pin and a second sub-pin of the connector in FIG. 2, and FIG. 20 which is another schematic exploded view of the cross-sectional structure of a third sub-pin and a fourth sub-pin of the connector in FIG. 2, among the plurality of second pins 4021, the volumes of the second sub-pin 40211 and the fourth sub-pin 40212 may be different.

In the present embodiment, among the plurality of second pins 4021 of the second connection board 402, the volumes of the second sub-pin 40211 and the fourth sub-pin 40212 may be set to be different, to distinguish between different types of second pins 4021. For example, the second sub-pin 40211 connected to a high-potential signal and vulnerable to static electricity, and the fourth sub-pin 40212 connected to a low-potential signal and difficult to be damaged by static electricity, may have different volumes. Optionally, the volume of the second sub-pin 40211 may be set to be larger than the volume of the fourth sub-pin 40212. Therefore, the space for plugging of the first sub-pin 40111 on the first connection board 401 that matches the second sub-pin 40211 may be larger, and the space for plugging of the third sub-pin 40112 on the first connection board 401 that matches the fourth sub-pin 40212 may be small, such that the fool-proof design for accessing different types of second pins 4021 may be achieved. When the second sub-pin 40211 with a larger volume is misaligned and plugged into the position of the third sub-pin 40112 with a smaller pluggable space, the second sub-pin 40211 that is easily damaged by static electricity and is connected to a high-potential signal may be unable to be plugged into the position of third sub-pin 40112 with a smaller pluggable space. Therefore, a conductive path may not be formed between the second sub-pin 40211 that is easily damaged by static electricity and is connected to the high-potential signal and the first connection board 401, thereby protecting the second sub-pin 40211 which is easily damaged by static electricity and avoiding the problem of electrostatic damage caused by the conduction of the vulnerable sub-pins that are connected to the high-potential signal instantly when being wrong plugged. The connector 40 may be further protected from the electrostatic damage and the electrostatic protection effect of the display module 000 may be improved.

Figure 21:
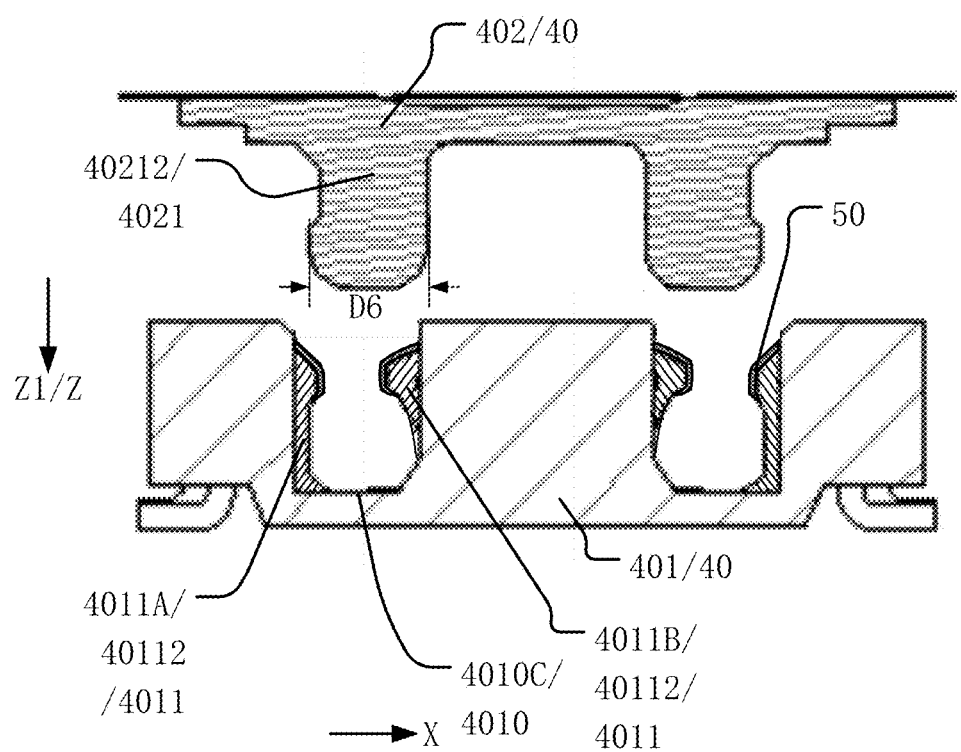
FIG. 21 illustrates another exploded view of cross-section structures of a portion of third sub-pins and fourth sub-pins in a connector in FIG. 2 consistent with various disclosed embodiments in the present disclosure.
Figure 22:
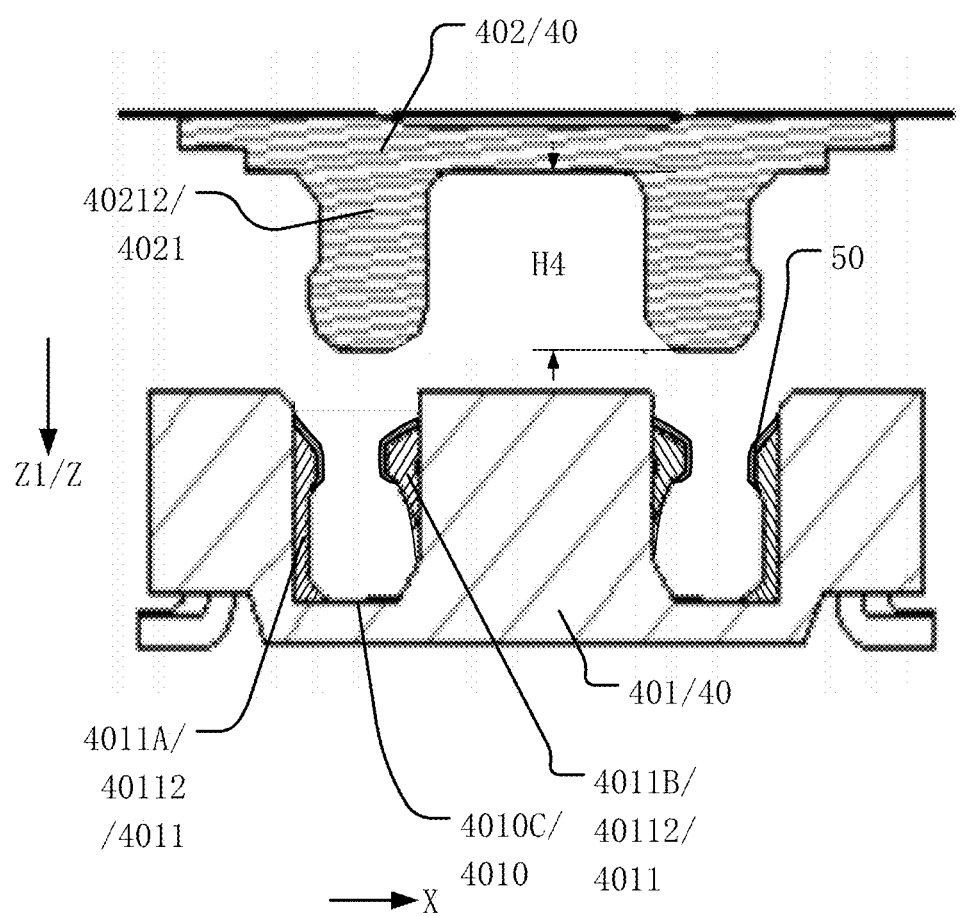
FIG. 22 illustrates another exploded view of cross-section structures of a portion of third sub-pins and fourth sub-pins in a connector in FIG. 2 consistent with various disclosed embodiments in the present disclosure.

In the present embodiment, as shown in FIG. 19 and FIG. 20, that the volumes of the second sub-pin 40211 and the fourth sub-pin 40212 are different may be specifically reflected as that the overall size of the fourth sub-pin 40212 in FIG. 20 may be smaller than that of the second sub-pin 40211 in FIG. 19. In some other optional embodiments, as shown in FIG. 19 and FIG. 21 which is another exploded structure of the cross-sectional structure of the third sub-pin and the fourth sub-pin of the connector in FIG. 2, in the direction X parallel to the plane where the first connection board 401 is located, the thickness D5 of the second sub-pin 40211 may be larger than the thickness D6 of the fourth sub-pin 40212. Therefore, in the direction X parallel to the plane of the first connection board 401, the pluggable width of the first sub-pin 40111 on the first connection board 401 that matches the second sub-pin 40211 may be larger, and the pluggable width of the third sub-pin 40112 on the first connection board 401 that matches the fourth sub-pin 40212 may be smaller, such that the first sub-pin 40111 on the first connection board 401 and the second sub-pin 40211 on the second connection board 402 may be able to be matched and plugged, and the third sub-pin 40112 on the first connection board 401 and the fourth sub-pin 40212 on the second connection board 402 may be able to be matched and plugged.

In some other optional embodiments, as shown in FIG. 1, FIG. 2, FIG. 19 and FIG. 22 which is another exploded view of the cross-sectional structure of the third sub-pin and the fourth sub-pin of the connector in FIG. 2, in the direction Z perpendicular to the plane where the first connection board 401 is located, the height H3 of the second sub-pin 40211 may be smaller than the height H4 of the fourth sub-pin 40212. Therefore, in the direction Z perpendicular to the plane where the first connection board 401 is located, the depth of the groove 4010 at the position corresponding to the first sub-pin 40111 on the first connection board 401 that matches the second sub-pin 40211 may be smaller than the depth of the groove 4010 at the position corresponding to the third sub-pin 40112 on the first connection board 401 that matches the fourth sub-pin 40212. In the present embodiment, that the volumes of the second sub-pin 40211 and the fourth sub-pin 40212 are different may also be reflected that the height H3 of the second sub-pin 40211 may be smaller than the height H4 of the fourth sub-pin 40212 in the direction Z perpendicular to the plane where the first connection board 401 is located. That is, the height of the second sub-pin 40211 that is easily damaged by static electricity and connected to the high-potential signal may be lower, and the depth of the groove 4010 at the position corresponding to the matching first sub-pin 40111 on the first connection board 401 may be also shallower. When the second sub-pin 40211 with the lower height is plugged into the third sub-pin 40112 on the first connection board 401 with the deeper depth in misaligned plugging, since the height H3 of the second sub-pin 40211 is smaller than the height H4 of the fourth sub-pin 40212, the depth of the groove 4010 at the corresponding position of the third sub-pin 40112 may be deeper, and the second sub-pin 40211 may not contact the conductive part of the third sub-pin 40112 to conduct. Therefore, a conductive path may not be formed between the second sub-pin 40211 that is easily damaged by static electricity and is connected to the high-potential signal and the first connection board 401, thereby protecting the second sub-pin 40211 which is easily damaged by static electricity and avoiding the problem of electrostatic damage caused by the conduction of the vulnerable sub-pins that are connected to the high-potential signal instantly when being wrong plugged. The connector 40 may be further protected from the electrostatic damage and the electrostatic protection effect of the display module 000 may be improved.

Figure 23:
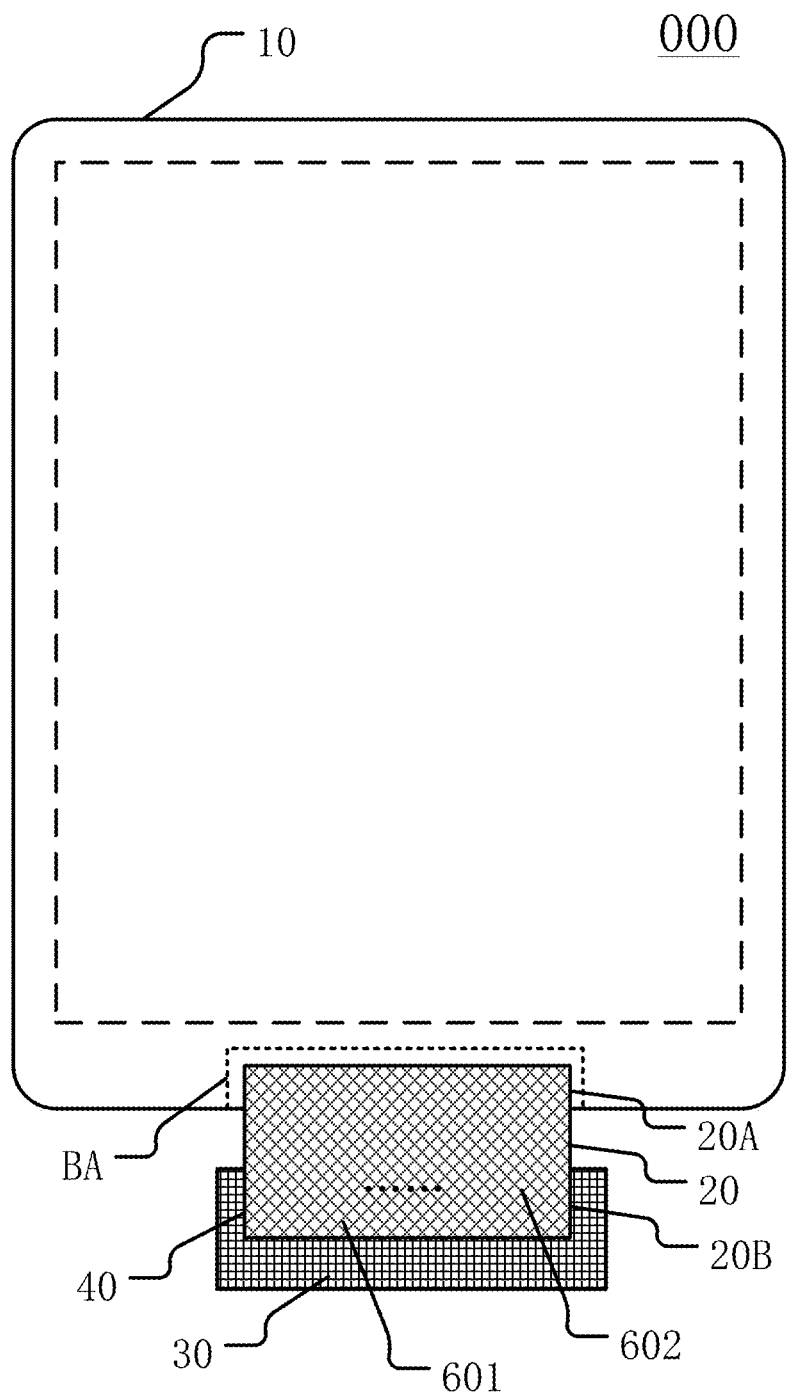
FIG. 23 illustrates another planar structure of a display module consistent with various disclosed embodiments in the present disclosure.
Figure 24:
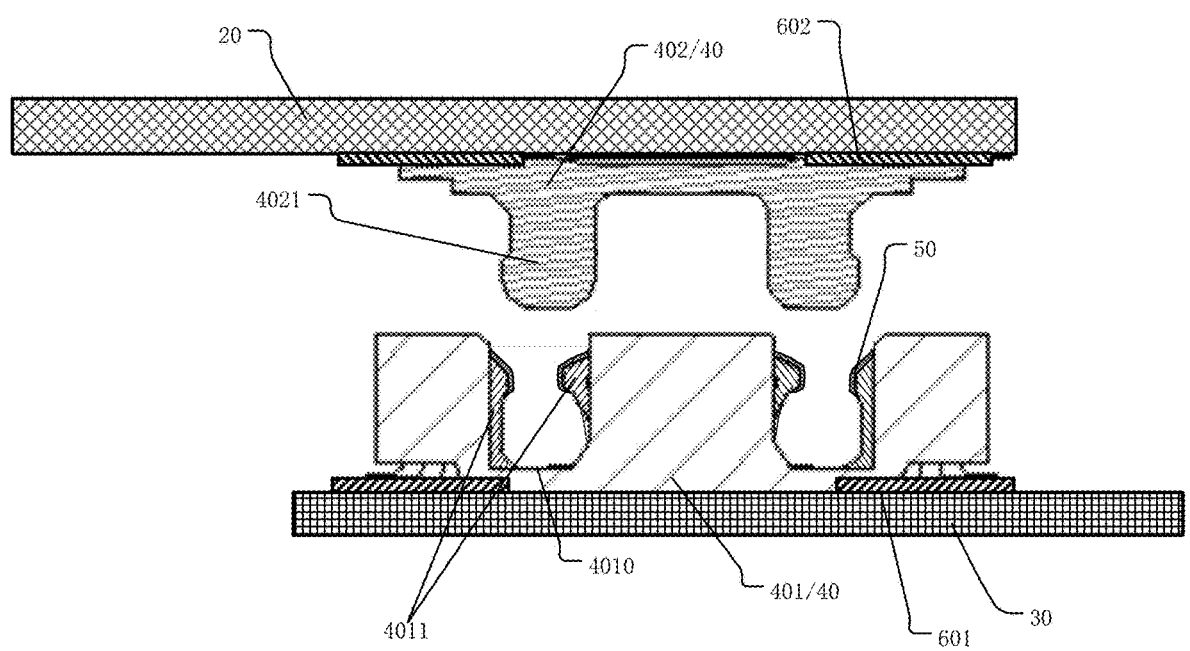
FIG. 24 illustrates a connecting structure of a flexible circuit board and a printed circuit board in FIG. 23 consistent with various disclosed embodiments in the present disclosure.

In some optional embodiments, as shown in FIG. 23 which is another schematic plan view of the display module and FIG. 24 which is a connection structure of the flexible circuit board and the printed circuit board in FIG. 23, the bottom of the first connection board 401 away from the second connection board 402 may include a plurality of first conductive pads 601, and the first connection board 401 may be bonded and electrically connected to the printed circuit board through the plurality of first conductive pads 601.

The bottom of the second connection board 402 away from the first connection board 401 may include a plurality of second conductive pads 602, and the second connection board 402 may be bonded and electrically connected to the flexible circuit board 20 through the plurality of second conductive pads 602.

In the present embodiment, when the flexible circuit board 20 and the printed circuit board 30 are directly plugged to achieve electrical connection through the connector 40, the bottom of the first connection board 401 away from the second connection board 402 may include the plurality of first conductive pads 601, and the bottom of the second connection board 402 away from the first connection board 401 may include the plurality of second conductive pads 602. The first connection board 401 may be bonded and electrically connected to the printed circuit board through the plurality of first conductive pads 601 at the corresponding position, and the second connection board 402 may be bonded and electrically connected to the flexible circuit board 20 through the plurality of second conductive pads 602 at the corresponding position. Therefore, the electrical conduction between the flexible circuit board 20 and the printed circuit board 30 may be achieved by the electrical contacts through pin plugging of the first connection board 401 and the second connection board 402 of the connector 40, such that the driving signal provided by the printed circuit board 30 is transmitted to the flexible circuit board 20 through the pins of the connector 40. The flexible circuit board 20 may be electrically bonded connected to the display panel 10 in the bonding area BA of the display panel 10, such that the driving signal of the printed circuit board 30 may be provided to the display panel 10 for providing the display panel 10 with a driving signal for realizing functions such as display.

In one embodiment, each of the plurality of first conductive pads 601 on the first connection board 401 and a corresponding one of the plurality of first pins 4011 may be electrically connected correspondingly inside the first connection board 401, and each of the plurality of second conductive pad 602 on the second conduction board 402 and a corresponding one of the plurality of second pins 4021 may be electrically connected correspondingly inside the second connection board 402 (the connecting circuit layer inside the connection board is not shown in the figure). A connection board itself may be understood as a structure including a circuit layer, and the present disclosure does not limit the circuit structure inside the connector 40, as long as the flexible circuit board 20 and the printed circuit board 30 are able to realize signal transmission through the connector 40.

Figure 25:
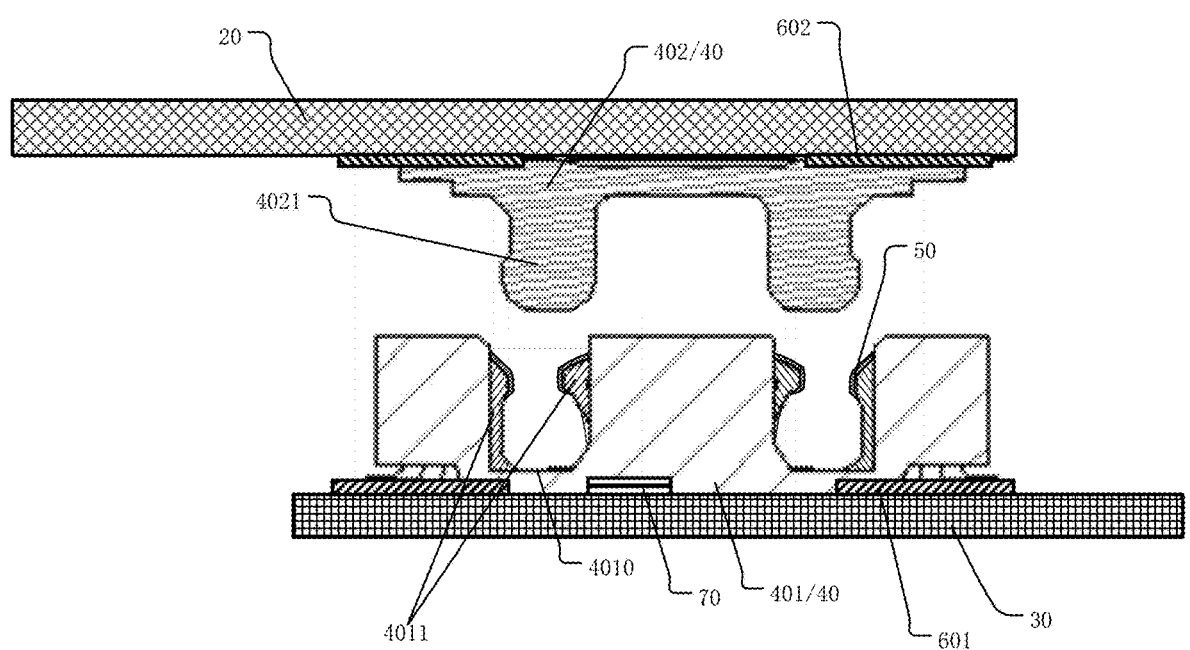
FIG. 25 illustrates another connecting structure of a flexible circuit board and a printed circuit board in FIG. 23 consistent with various disclosed embodiments in the present disclosure.

In some optional embodiments, as shown in FIG. 23 and FIG. 25 which is a schematic diagram of another connection structure of the flexible circuit board and the printed circuit board in FIG. 23, the bottom of the first connection board 401 away from the second connection board 402 may include gate switches 70, and the gate switches 70 may be configured to control the plurality of first pins 4011 of the first connection board 401 to be conductive or non-conductive.

In the present embodiment, the connector 40 for plugging and electrically connecting the flexible circuit board 20 and the printed circuit board 30 may be provided with the gate switches 70. Optionally, the gate switch 70 may be provided on the bottom of the first connection board 401 away from the second connection board 402. Two or more gate switches 70 may be respectively disposed on the bottom of two ends of the first connection board 401, and the gate switches 70 may be used to control the plurality of first pins 4011 of the first connection boards 401 to be conductive or non-conductive. For example, when the gate switches 70 are pressed, the plurality of first pins 4011 on the first connection board 401 and the internal circuit layer of the first connection board 401 may be electrically connected, and the first pins 4011 may carry electricity. When the gate switches 70 are not pressed, the plurality of first pins 4011 on the first connection board 401 and the internal circuit layer of the first connection board 401 may be not conductive, and the plurality of first pins 4011 may not be charged. At this time, when the operator makes mistakes in misaligned plugging, the electrostatic damage caused by the misaligned plugging contact may be avoided, thereby protecting the connector 40 from electrostatic damage and improving the electrostatic protection effect of the display module 000.

Figure 26:
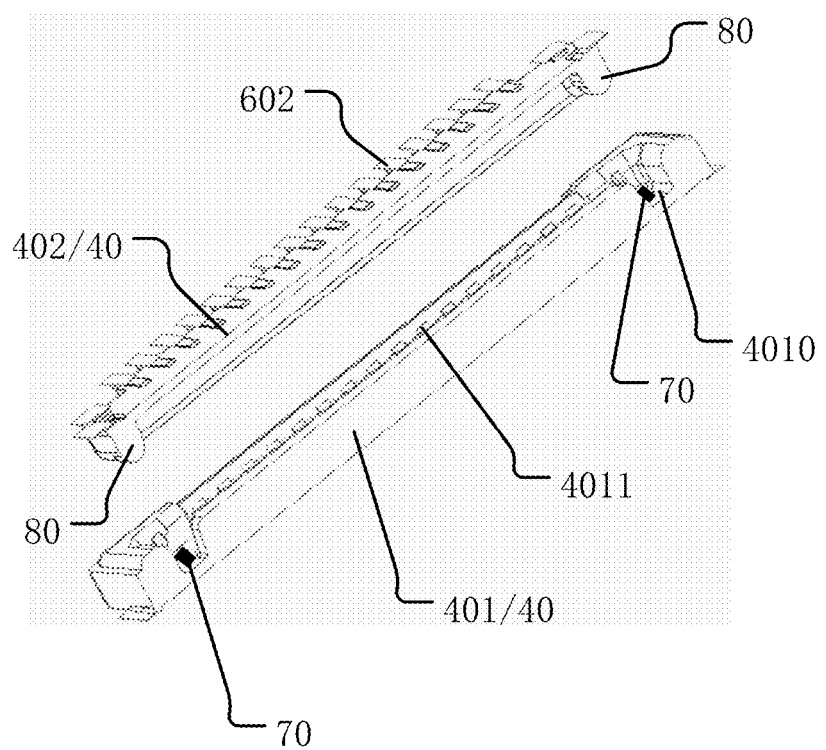
FIG. 26 illustrates a three-dimensional exploded structure of a connector in FIG. 23 consistent with various disclosed embodiments in the present disclosure.

As shown in FIG. 23 and FIG. 26 which is a schematic diagram of the three-dimensional exploded structure of the connector in FIG. 23, in one embodiment, the gate switches 70 may be disposed at the bottom of the groove 4010 opened on the first connection board 401. When the plurality of second pins 4021 of the second connection board 402 is correctly plugged into the groove 4010 of the first connection board 401, a bump 80 of the second connection board 401 may press the gate switches 70 at the corresponding position in the groove 4010, the plurality of first pins 4011 on the first connection board 401 may be electrically connected to the internal circuit layer of the first connection board 401, and the plurality of first pins 4011 may be charged. When the plurality of second pins 4021 of the second connection board 402 are misaligned and plugged into the groove 4010 of the first connection board 401, the bump 80 of the second connection board 401 may not press the gate switches 70 at the corresponding position in the groove 4010, then the gate switches 70 may not be pressed. Correspondingly, the plurality of first pins 4011 and the internal circuit layer of the first connection board 401 may be not conductive, and the plurality of first pins 4011 may be not charged. That is, when the first connection board 401 and the second connection board 402 are misaligned and plugged, the gate switches 70 may avoid electrostatic damage caused by misaligned and plugged contacts, thereby protecting the connector 40 from electrostatic damage and improving the electrostatic protection effect of the display module 000.

It can be understood that the present disclosure does not specifically limit the design structure and setting position of the gate switches 70, and the embodiments shown in FIG. 25 and FIG. 26 are only for illustration. During the specific implementation, the setting position of the gate switches 70 is not limited to this, and may be performed according to actual design requirements, which will not be repeated in this embodiment.

Figure 27:
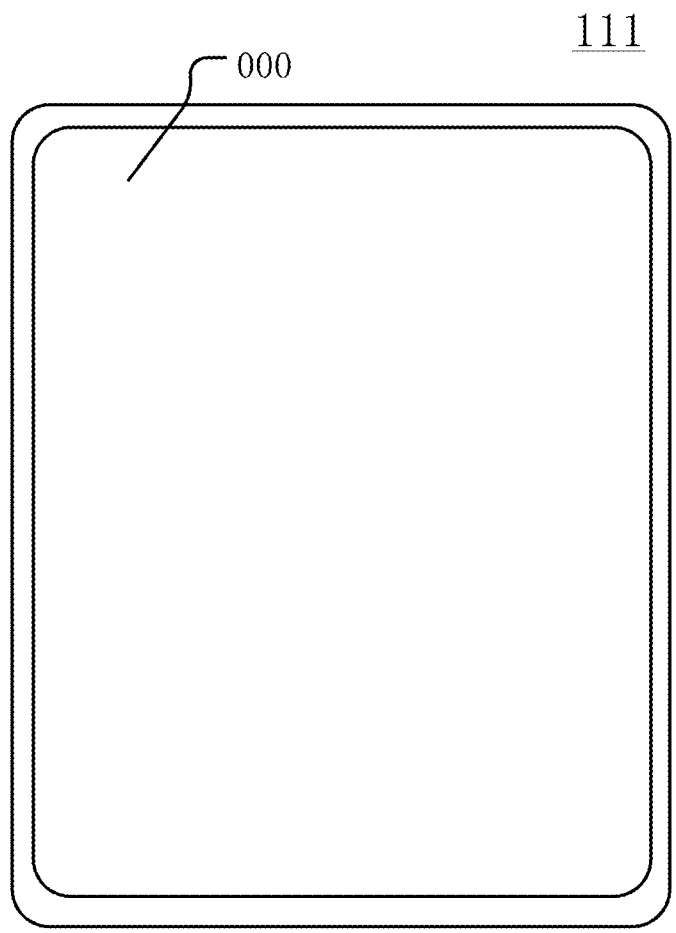
FIG. 27 illustrates an exemplary display device consistent with various disclosed embodiments in the present disclosure.

The present disclosure also provides a display device. As shown in FIG. 27, in one embodiment, the display device 111 may include any display panel 000 provided by various embodiments of the present disclosure. The embodiment shown in FIG. 27 where the display device 111 is a cell phone is used as an example only to illustrate the present disclosure, and does not limit the scopes of the present disclosure. In some other embodiments, the display device 111 may be any display device with display function, such as a computer, a television, a touch controller, or a vehicle display device.

In the present disclosure, the display module may include the display panel, the flexible circuit board and the printed circuit board that are bound and electrically connected to the display panel. The flexible circuit board and the printed circuit board may be bonded and electrically connected to the display panel in the bonding area of the display panel. The flexible circuit board and the printed circuit board may be connected through the connector, such that the printed circuit board may provide the display panel with electrical signals that drive it to realize functions such as display through the circuits on the flexible circuit board. The connector may include the first connection board and the second connection board. The side of the first connection board facing the second connection board may include the groove, and the groove may include the plurality of first pins. The side of the second connection board facing the first connection board may include the plurality of second pins. The plurality of first pins and the plurality of second pins may have a one-to-one correspondence. The electrical connection between the display panel and the printed circuit board may be easily and quickly completed by plugging and unplugging between the first connection board and the second connection board of the connector. The industrialized mass production of the module may be achieved. Further, a partial area of at least one of the plurality of first pins in the first connection board may be coated with the first insulating layer. When the flexible circuit board and the printed circuit board are electrically connected through the connector, the plurality of second pins of the second connection board may be plugged into the groove of the first connection board, and electrically connected to the corresponding first pins. Since there is the first insulating layer coated in part of the plurality of first pins, the electrostatic breakdown because of the instantaneous contact between the plurality of first pins and the plurality of second pins during the instantaneous misaligned plugging, thereby preventing electrostatic damage to the display panel during the plugging operation with electricity. Also, since the first insulating layer is not coated on the entire surface of the plurality of first pins, the first insulating layer may not affect the conductivity of the plurality of first pins, ensuring that the plurality of second pins and the part of the plurality of first pins not covered by the first insulating layer are still able to be in contact to achieve the conductive transmission between the first connection board and the second connection board when the first connection board and the second connection board are plugged.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display module, comprising a display panel, a flexible circuit board, and a printed circuit board, wherein:
   the display panel includes a bonding area;
   the flexible circuit board and the printed circuit board are electrically bonded and connected to the display panel in the bonding area;
   the flexible circuit board and the printed circuit board are connected by a connector;
   the connector includes a first connection board and a second connection board;
   a side of the first connection board facing the second connection board includes a groove;
   the groove includes a plurality of first pins;
   a side of the second connection board facing the first connection board includes a plurality of second pins;
   the plurality of first pins and the plurality of second pins have a one-to-one correspondence;
   the plurality of second pins is plugged into the grooves, and is in contact with and electrically connected to the plurality of first pins; and
   a portion of at least one of the plurality of first pins is coated with a first insulating layer.

2. The display module according to claim 1, wherein:
   a shape of an orthographic projection of the groove on the plane where the first connection board is located includes a long strip;
   the groove includes a first side wall and a second side wall;
   one first pin of the plurality of first pins includes a first sub-section and a second sub-section, wherein the first sub-section is arranged on the first side wall and the second sub-section is arranged on the second side wall;
   in a direction perpendicular to the plane where the first connection board is located, the first sub-section and/or the second sub-section includes a first region and a second region, wherein the first region is located at a side of the second region close to a bottom of the groove; and
   in a direction from the first sub-section to the second sub-section, a thickness of the first sub-section of the first region is smaller than a thickness of the first sub-section of the second region; and/or, in the direction from the first sub-section to the second sub-section, a thickness of the second sub-section of the first region is smaller than a thickness of the second sub-section of the second region.

3. The display module according to claim 2, wherein:
   the first insulating layer is located on a surface of the first sub-section of the second region; and/or the first insulating layer is located on a surface of the second sub-section of the second region.

4. The display module according to claim 2, wherein:
   in a direction from the second region to the first region, a thickness of the first sub-section in the direction from the first sub-section to the second sub-section increases first, then does not change, and then decreases;
   in the direction from the second region to the first region, a thickness of the second sub-section in the direction from the first sub-section to the second sub-section increases first, then does not change, and then decreases;
   in the direction from first sub-section to the second sub-section, a region where the thicknesses of the first sub-section and the second sub-section increase is a first sub-region, and a region where the thicknesses of the first sub-region and the second sub-region remain unchanged is a second sub-region; and
   the first insulating layer is coated on the first sub-section in the first sub-region and on the second sub-section of the first sub-region.

5. The display module according to claim 4, wherein:
   the first insulating layer is coated on the first sub-section in the second sub-region and on the second sub-section of the second sub-region.

6. The display module according to claim 1, wherein:
   the first insulating layer is made of a material including a metal chelate compound, and/or
   a thickness of the first insulating layer is about 0.04 mm to about 0.1 mm.

7. The display module according to claim 1, wherein:
   the plurality of the first pins at least includes first sub-pins and third sub-pins, wherein signals connected to the first sub-pins and signals connected to the third sub-pins have different types;
   the plurality of second pin includes second sub-pins and fourth sub-pins, wherein signals connected to the second sub-pins and signals connected to the fourth sub-pins have different types;
   the second sub-pins are plugged into and correspond to the first sub-pins, and the fourth sub-pins are plugged into and correspond to the third sub-pins; and
   shapes of the first sub-pins are different from shapes of the third sub-pins.

8. The display module according to claim 7, wherein:
   the display panel includes a light-emitting element, wherein the light-emitting element is connected to a first power supply signal;
   the flexible circuit board and the printed circuit board are connected to a second power supply signal;

the display panel includes a touch electrode, wherein the touch electrode is connected to a touch control drive signal;

the signals connected to the first sub-pins and/or the second sub-pins include any one of the first power supply signal, the second power supply signal, or the touch control drive signal.

9. The display module according to claim 7, wherein:
a first protrusion is disposed on the bottom of the groove at a position corresponding to the first sub-pins;
a side surface of the second sub-pins facing the first sub-pin includes a first groove;
the first sub-pins are plugged into and connected to the first groove; and
the first protrusion and the first groove are matched with each other.

10. The display module according to claim 9, wherein:
the first sub-pins include at least a first-type first sub-pin and a second-type first sub-pin, wherein signals connected to the first-type first sub-pin and the second-type first sub-pin are different; and
a shape of the first-type first sub-pin is different form a shape of the second-type first sub-pin.

11. The display module according to claim 10, wherein:
in the direction perpendicular to the plane where the first connection board is located, a height of the first protrusion corresponding to the first-type first sub-pin is different from a height of the first protrusion corresponding to the second-type first sub-pin; or
in a direction parallel to the plane where the first connection board is located, a width of the first protrusion corresponding to the first-type first sub-pin is different from a width of the first protrusion corresponding to the second-type first sub-pin.

12. The display module according to claim 9, wherein:
shapes of the first groove/the first protrusion include one or more of cones, trapezoids, ovals, circles, triangles, squares, or rectangles.

13. The display module according to claim 9, wherein:
a second groove is disposed on the bottom of the groove at a position corresponding to the third sub-pins;
a side surface of the fourth sub-pins facing the third sub-pin includes a second protrusion;
the second protrusion is plugged and connected to the second groove; and
the second protrusion and the second groove are matched with each other.

14. The display module according to claim 7, wherein:
in the plurality of second pins, a volume of the second sub-pins is different from a volume of the fourth sub-pins.

15. The display module according to claim 14, wherein:
the volume of the second sub-pins is larger than the volume of the fourth sub-pins.

16. The display module according to claim 14, wherein:
in the direction parallel to the plane where the first connection board is located, a thickness of the second sub-pins is larger than a thickness of the fourth sub-pins.

17. The display module according to claim 14, wherein:
in the direction perpendicular to the plane where the first connection board is located, a height of the second sub-pins is smaller than a height of the fourth sub-pins; and
in the direction perpendicular to the plane where the first connection board is located, a depth of the groove at the position corresponding to the first sub-pins is smaller than a depth of the groove at the position corresponding to the third sub-pins.

18. The display module according to claim 1, wherein:
a bottom of the first connection board away from the second connection board includes a plurality of first conductive pads, wherein the first connection board is electrically bonded and connected to the printed circuit board through the plurality of first conductive pads; and
a bottom of the second connection board away from the first connection board includes a plurality of second conductive pads, wherein the second connection board is electrically bonded to the flexible circuit board through the plurality of second conductive pads connect.

19. The display module according to claim 1, wherein:
a gating switch is disposed at a bottom of the first connection board away from the second connection board, and is used to control the plurality of first pins of the first connection board to conduct or not conduct electricity.

20. A display device, comprising a display module including a display panel, a flexible circuit board, and a printed circuit board, wherein:
the display panel includes a bonding area;
the flexible circuit board and the printed circuit board are electrically bonded and connected to the display panel in the bonding area;
the flexible circuit board and the printed circuit board are connected by a connector;
the connector includes a first connection board and a second connection board;
a side of the first connection board facing the second connection board includes a groove;
the groove includes a plurality of first pins;
a side of the second connection board facing the first connection board includes a plurality of second pins;
the plurality of first pins and the plurality of second pins have a one-to-one correspondence;
the plurality of second pins is plugged into the grooves, and is in contact with and electrically connected to the plurality of first pins; and
a portion of at least one of the plurality of first pin is coated with a first insulating layer.

* * * * *